(12) United States Patent
Takada et al.

(10) Patent No.: US 8,716,836 B2
(45) Date of Patent: May 6, 2014

(54) SEMICONDUCTOR WAFER, SEMICONDUCTOR WAFER MANUFACTURING METHOD, AND ELECTRONIC DEVICE

(75) Inventors: Tomoyuki Takada, Tsukuba (JP); Sadanori Yamanaka, Tsukuba (JP); Masahiko Hata, Tsuchiura (JP); Taketsugu Yamamoto, Tsukuba (JP); Kazumi Wada, Bunkyo-ku (JP)

(73) Assignees: Sumitomo Chemical Company, Limited, Tokyo (JP); The University of Tokyo, Tokyo (JP)

( * ) Notice: Subject to any disclaimer, the term of this patent is extended or adjusted under 35 U.S.C. 154(b) by 375 days.

(21) Appl. No.: 12/811,011

(22) PCT Filed: Dec. 26, 2008

(86) PCT No.: PCT/JP2008/004037
§ 371 (c)(1),
(2), (4) Date: Aug. 26, 2010

(87) PCT Pub. No.: WO2009/084238
PCT Pub. Date: Jul. 9, 2009

(65) Prior Publication Data
US 2010/0308376 A1 Dec. 9, 2010

(30) Foreign Application Priority Data
Dec. 28, 2007 (JP) ................. 2007-341411

(51) Int. Cl.
*H01L 21/331* (2006.01)
*H01L 29/737* (2006.01)
(52) U.S. Cl.
USPC ............. 257/586; 257/E29.188; 438/312; 438/493

(58) Field of Classification Search
USPC ............. 257/586, E29.188; 438/312, 493
See application file for complete search history.

(56) References Cited

U.S. PATENT DOCUMENTS

| 4,614,564 A | 9/1986 | Sheldon et al. |
| 5,238,869 A * | 8/1993 | Shichijo et al. ............ 438/492 |

(Continued)

FOREIGN PATENT DOCUMENTS

| JP | 60210831 | 10/1985 |
| JP | 61094318 | 5/1986 |

(Continued)

OTHER PUBLICATIONS

Chinese Office Action dated Jul. 2, 2012 issued in Chinese Application No. 200880119896.8.

(Continued)

*Primary Examiner* — Steven J Fulk
(74) *Attorney, Agent, or Firm* — Sughrue Mion, PLLC

(57) ABSTRACT

A high-quality GaAs-type crystal thin film using an inexpensive Si wafer with good thermal release characteristics is achieved. Provided is a semiconductor wafer comprising an Si wafer; an inhibiting layer that is formed on the wafer and that inhibits crystal growth, the inhibiting layer including a covering region that covers a portion of the wafer and an open region that does not cover a portion of the wafer within the covering region; a Ge layer that is crystal-grown in the open region; and a functional layer that is crystal-grown on the Ge layer. The Ge layer may be formed by annealing with a temperature and duration that enables movement of crystal defects, and the annealing is repeated a plurality of times.

34 Claims, 41 Drawing Sheets

(56) References Cited

U.S. PATENT DOCUMENTS

| | | | |
|---|---|---|---|
| 5,323,032 A * | 6/1994 | Sato et al. | 257/198 |
| 2002/0192894 A1* | 12/2002 | Kalnitsky et al. | 438/235 |
| 2004/0166645 A1* | 8/2004 | Shideler | 438/312 |
| 2005/0104127 A1* | 5/2005 | Kang et al. | 257/350 |
| 2007/0054465 A1* | 3/2007 | Currie et al. | 438/455 |

FOREIGN PATENT DOCUMENTS

| | | | |
|---|---|---|---|
| JP | 61-135115 A | | 6/1986 |
| WO | 2005084231 A2 | | 9/2005 |
| WO | 2006/125040 A2 | | 11/2006 |

OTHER PUBLICATIONS

Chinese Office Action dated Jul. 18, 2011, corresponding to Chinese Patent Application No. 200880119896.8.

Second Office Action issued Jul. 2, 2012 in Chinese Patent Application No. 200880119896.8 with English translation.

K.S. Kim et al., "Quality-enhanced GaAs layers grown on Ge/Si substrates by metalorganic chemical vapor deposition", Journal of Crystal Growth, 1997, pp. 427-432, vol. 179, No. 3-4.

Hsin-Chiao Luan et al., "High-quality Ge epilayers on Si with low threading-dislocation densities", Applied Physics Letters, Nov. 8, 1999, pp. 2909-2911, vol. 75, No. 19.

W.E. McMahon et al., "An STM and LEED study of MOCVD-prepared P/Ge (100) to (111) surfaces", Surface Science, 2004, pp. 146-156, vol. 571, Nos. 1-3.

Japanese Office Action issued on Jul. 31, 2013 by the Japanese Patent Office in counterpart JP Application No. 2008-334830.

Taiwanese Office Action issued in counterpart TW Application No.: 097151173. dated Nov. 12, 2013.

\* cited by examiner

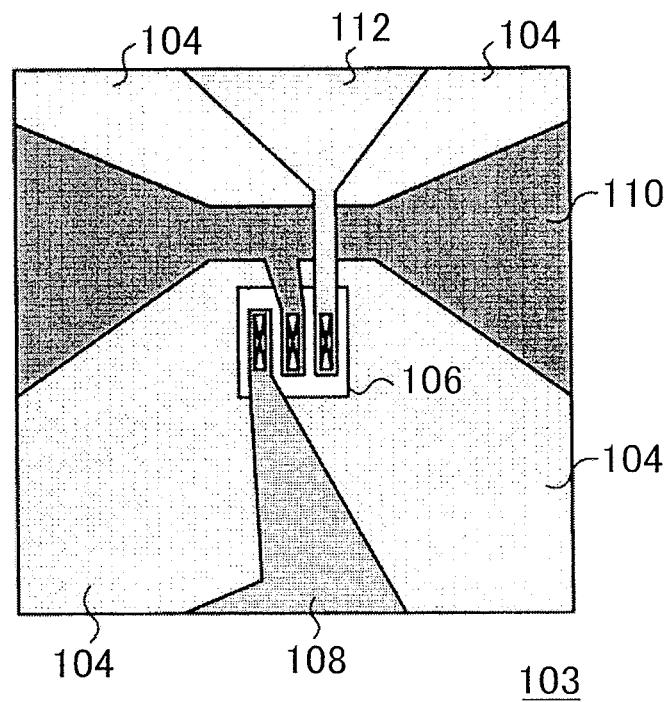
F I G . 2

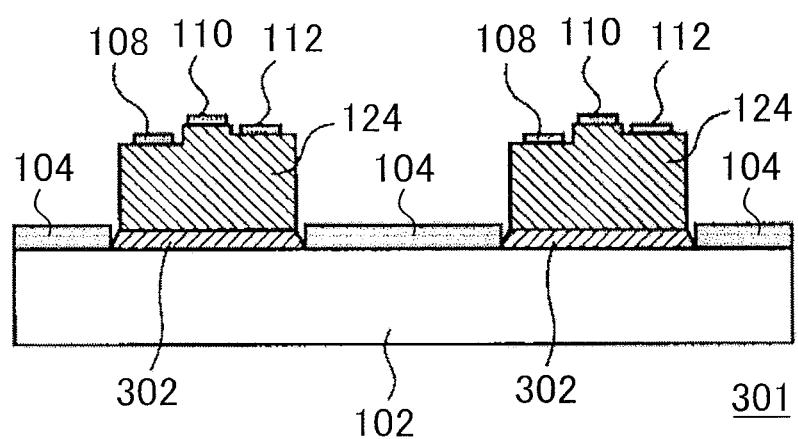
F I G . 14

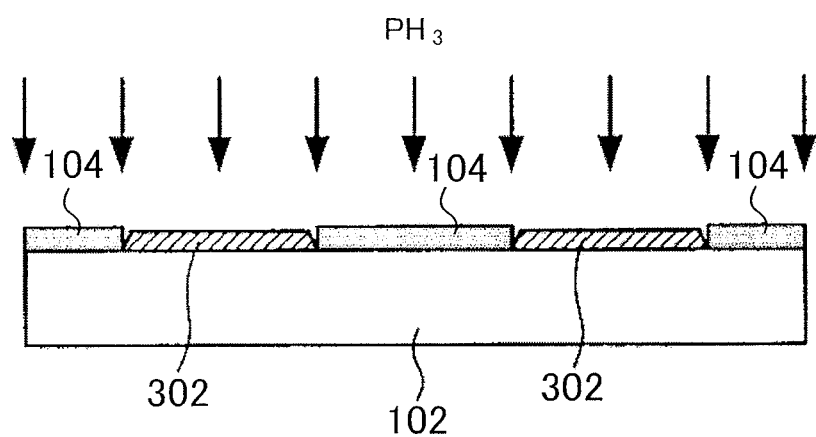
F I G. 15

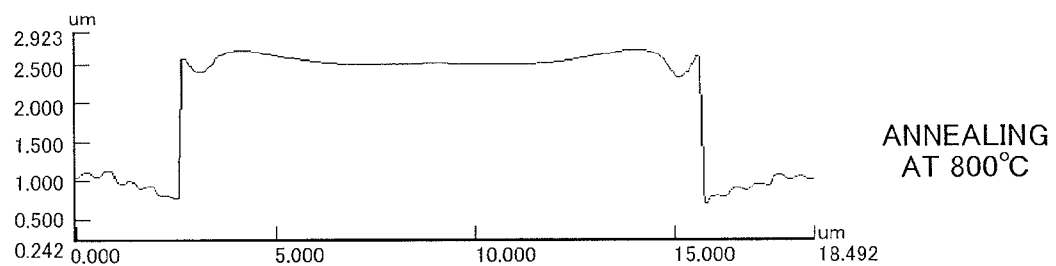
F I G. 19

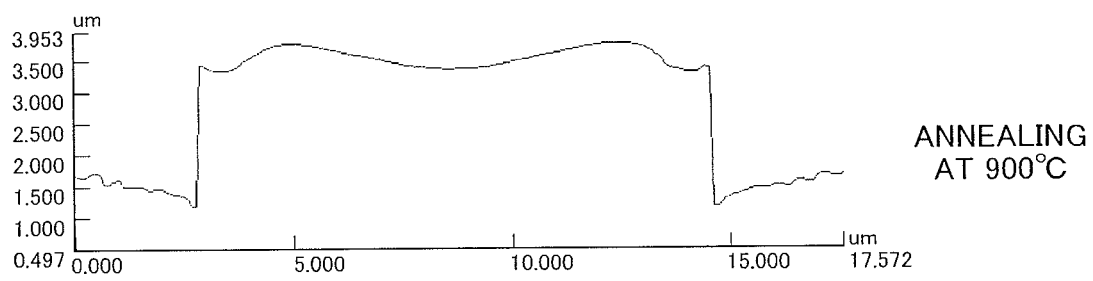
F I G . 21

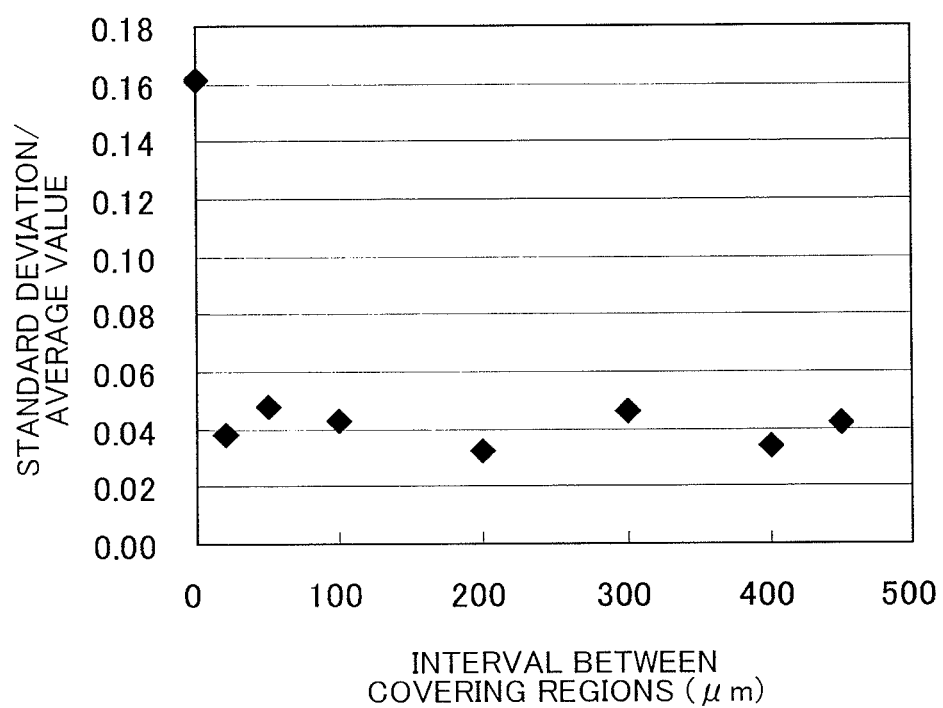
F I G. 23

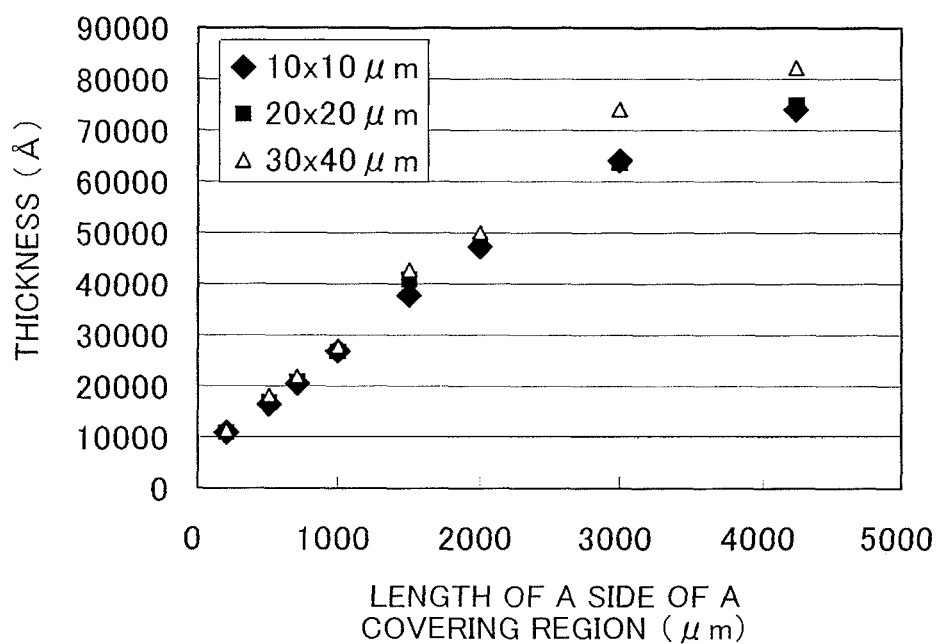
F I G . 24

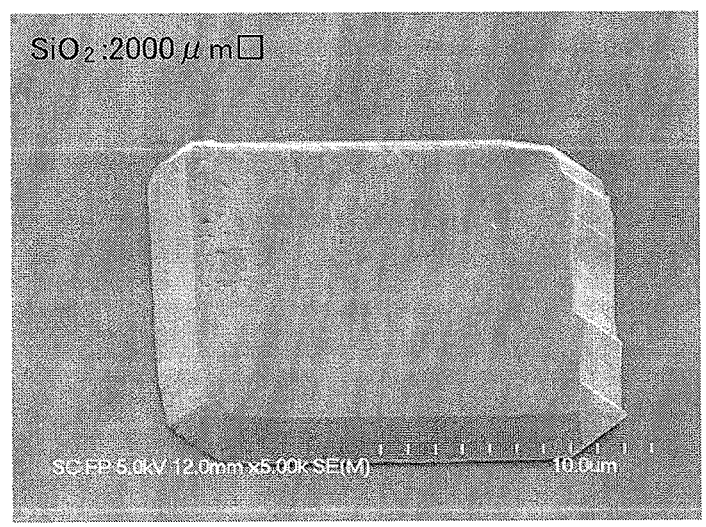
F I G . 31

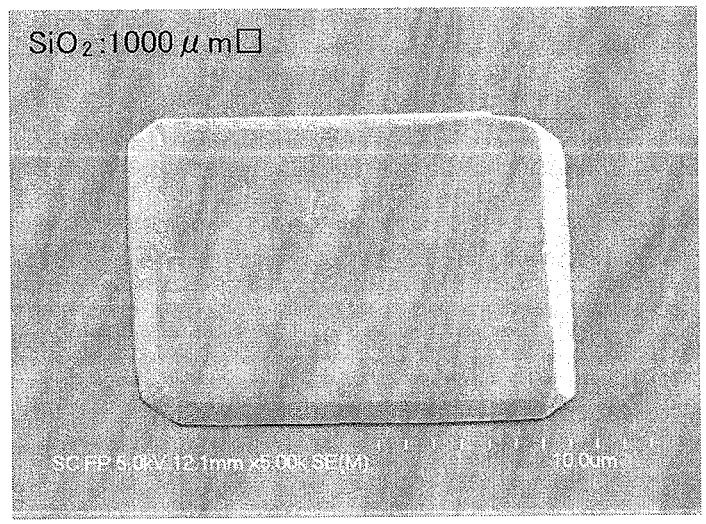
F I G . 32

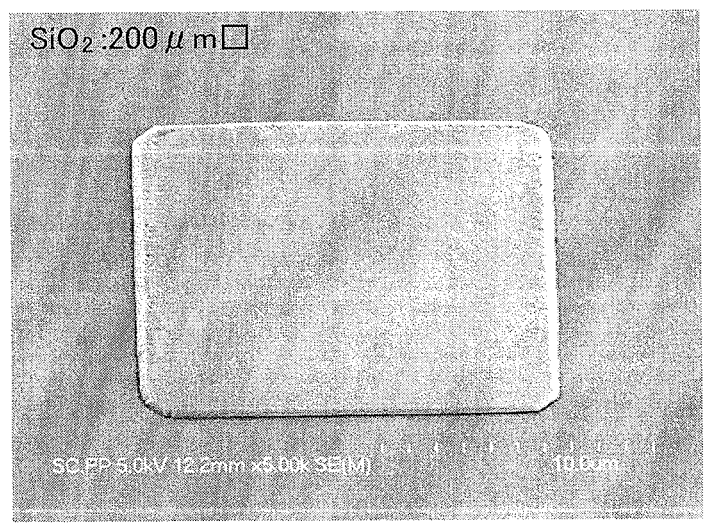
F I G . 34

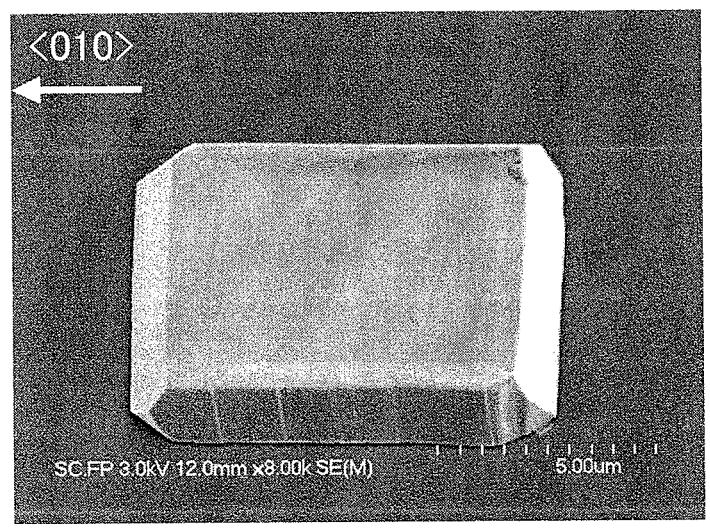
F I G. 36

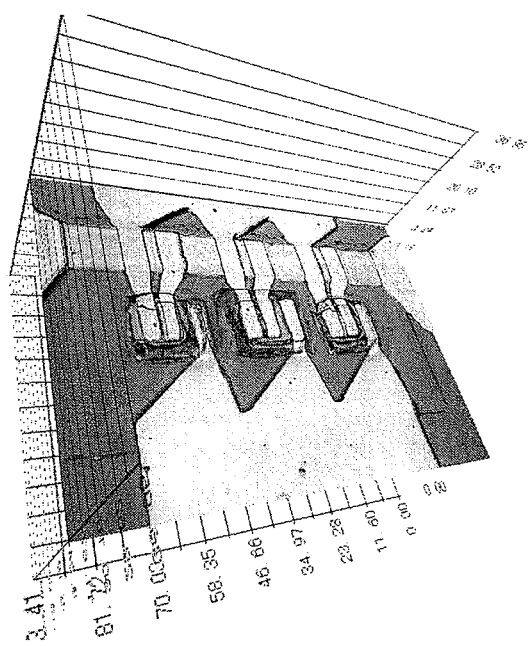
F I G . 40

SEMICONDUCTOR WAFER, SEMICONDUCTOR WAFER MANUFACTURING METHOD, AND ELECTRONIC DEVICE

TECHNICAL FIELD

The present invention relates to a semiconductor wafer, a method of manufacturing a semiconductor wafer, and an electronic device. In particular, the present invention relates to a semiconductor wafer, a method of manufacturing a semiconductor wafer, and an electronic device including a crystal thin film having good crystallinity formed on an inexpensive silicon wafer.

BACKGROUND ART

Various types of high-performance electronic devices are being developed that use heterojunctions in semiconductor devices therein made of compounds such as GaAs. Since the characteristics of these high-performance electronic devices are influenced by the quality of crystallinity, high quality crystal thin films are desired. The need for lattice matching at the heterointerfaces in thin film crystal growth of GaAs-based devices leads to the selection of wafers made of GaAs or of materials such as Ge whose lattice constant is very close to that of GaAs.

Non-Patent Document 1 discloses a technique for forming a high quality Ge epitaxial growth layer (sometimes referred to hereinafter as a "Ge epilayer") on an Si wafer. With this technique, the Ge epilayer is formed in a limited region on the Si wafer, and cyclic thermal annealing is then performed on the Ge epilayer to achieve an average dislocation density of $2.3 \times 10^6$ cm$^{-2}$.

Non-Patent Document 1: Hsin-Chino Luan et. al., "High-quality Ge Epilayers on Si with Low Threading-dislocation Densities" APPLIED PHYSICS LETTERS, Volume 75, No. 19, Nov. 8, 1999.

DISCLOSURE OF THE INVENTION

Problems to be Solved by the Invention

When manufacturing GaAs-type electronic devices, lattice matching is considered and a GaAs wafer or a wafer that can achieve lattice matching with GaAs, such as a Ge wafer, is selected, as described above. However, GaAs wafers or wafers that can achieve lattice matching with GaAs are expensive, and this increases the overall cost of the device. Furthermore, these wafers do not have sufficient heat dissipation characteristics, and this might result in limitations such as restrictions on the formation density of the devices in order to achieve a reliable thermal design or only using the devices in a temperature range for which thermal release can be achieved. Accordingly, there is a demand for a semiconductor wafer that can be manufactured using an inexpensive Si wafer with good thermal release characteristics and that has a high-quality GaAs-type crystal thin film. Therefore, it is an object of an aspect of the innovations herein to provide a semiconductor wafer, a method of manufacturing a semiconductor wafer, and an electronic device, which are capable of overcoming the above drawbacks accompanying the related art. The object can be achieved by combinations described in the independent claims. The dependent claims define further advantageous and exemplary combinations of the innovations herein.

Means for Solving the Problems

To solve the above problems, provided is a semiconductor wafer comprising an Si wafer; an inhibiting layer that is formed on the wafer and that inhibits crystal growth, the inhibiting layer including a covering region that covers a portion of the wafer and an open region that does not cover a portion of the wafer within the covering region; a Ge layer that is crystal-grown in the open region; and a functional layer that is crystal-grown on the Ge layer.

According to a first aspect of the invention, the Ge layer may be formed by annealing with a temperature and duration that enables movement of crystal defects, and the annealing may be repeated a plurality of times. A GaAs layer may be formed at a temperature no greater than 500° C. between the Ge layer and the functional layer, and a surface of the Ge layer facing the functional layer may be surface processed by a gas including P. The functional layer may be a group 3-5 compound layer or a group 2-6 compound layer that lattice matches or pseudo-lattice matches with Ge. For example, the functional layer may be a group 3-5 compound layer that lattice matches or pseudo-lattice matches with Ge, in which a group 3 element includes at least one of Al, Ga, and In and a group 5 element includes at least one of N, P, As, and Sb. The inhibiting layer may be an electric insulator. For example, the inhibiting layer may be a silicon oxide layer, a silicon nitride layer, a silicon oxynitride layer, an aluminum oxide layer, or a combination of these layers. The area of the open region may be no greater than 1 mm$^2$.

According to a second aspect of the invention, provided is a semiconductor wafer obtained by forming an inhibiting layer that inhibits crystal growth on a principal surface of an Si wafer and forming an opening in the inhibiting layer that passes therethrough in a direction substantially perpendicular to the principal surface of the wafer to expose the wafer; crystal-growing a Ge layer to contact the wafer within the opening; and crystal-growing a functional layer on the Ge layer.

According to a third aspect of the invention, provided is a semiconductor wafer comprising an Si wafer; an inhibiting layer provided on the Si wafer that has an opening and that inhibits crystal growth; a Ge layer formed in the opening; and a functional layer formed after forming the Ge layer. The functional layer may lattice match or pseudo-lattice match the Ge layer. The functional layer may be formed within the opening.

In the above semiconductor wafer, the Ge layer may be annealed in an atmosphere that contains hydrogen. The Ge layer may be selectively crystal-grown within the opening using a CVD method in an atmosphere that includes raw material gas containing halogen atoms. The semiconductor wafer may further include a GaAs layer formed at a temperature no greater than 600° C. between the Ge layer and the functional layer. A surface of the Ge layer that faces the functional layer may be surface processed with the gas including P. The functional layer may be a group 3-5 compound layer or a group 2-6 compound layer.

In the above semiconductor wafer, the functional layer may be a group 3-5 compound layer that includes at least one element selected from a group including Al, Ga, and In as a group 3 element and includes at least one element selected from a group including N, P, As, and Sb as a group 5 element. The arithmetic mean roughness of the functional layer may be no greater than 00.2 μm.

In the above semiconductor wafer, the inhibiting layer may be an electric insulator. The inhibiting layer may be at least one layer selected from a group including a silicon oxide layer, a silicon nitride layer, a silicon oxynitride layer, and an aluminum oxide layer.

In the above semiconductor wafer, the inhibiting layer may include a plurality of the openings, and the semiconductor wafer may further include an adsorbing section that adsorbs raw material of the functional layer more quickly than a top surface of the inhibiting layer and that is arranged between one of the openings and another opening adjacent to the one of the openings. The semiconductor wafer may include a plurality of the inhibiting layers; and an adsorbing section that adsorbs raw material of the functional layer more quickly than a top surface of any of the inhibiting layers and that is arranged between one of the inhibiting layers and another inhibiting layer that is adjacent to the one inhibiting layer.

In the above semiconductor wafer, the adsorbing section may be a groove that reaches the wafer. The width of the groove may be between 20 µm and 500 µm, inclusive. The semiconductor wafer may include a plurality of the adsorbing sections, and the plurality of the adsorbing sections may be arranged at uniform intervals.

In the above semiconductor wafer, the bottom surface area of the opening may be no greater than 1 mm$^2$. The bottom surface area of the opening may be no greater than 1600 µm$^2$. The bottom surface area of the opening may be no greater than 900 µm$^2$. The bottom surface of the opening may be shaped as a rectangle, and a long side of the rectangle may be no greater than 80 µm. The bottom surface of the opening may be shaped as a rectangle, and a long side of the rectangle may be no greater than 40 µm.

In the above semiconductor wafer, the principal surface of the wafer may be a (100) surface, a bottom surface of the opening may be shaped as a square or a rectangle, and at least one side of the square or the rectangle may be substantially parallel to a direction selected from a group including a <010> direction, a <0-10> direction, a <001> direction, and a <00-1> direction on the principal surface. The principal surface of the wafer may be a (111) surface, a bottom surface of the opening may be shaped as a hexagon, and at least one side of the hexagon may be substantially parallel to a direction selected from a group including a <1-10> direction, a <-110> direction, a <0-11> direction, a <01-1> direction, a <10-1> direction, and a <-101> direction on the principal surface. In the Miller index used to indicate a direction or a surface of a crystal, negative integers are usually represented by a bar over the number. However, in this Specification, negative integers are represented by a minus sign, for case of explanation. For example, a surface that crosses values of 1, −2, and 3 respectively on an a-axis, a b-axis, and a c-axis in a unit cell is described as a (1-23) surface. Miller indices for directions are represented in the same way.

According to a fourth aspect of the invention, provided is a method of manufacturing a semiconductor wafer including forming an inhibiting layer that inhibits crystal growth on a silicon wafer; patterning the inhibiting layer to form a covering region that covers a portion of the wafer and an open region that does not cover the wafer within the covering region; crystal-growing a Ge layer at least in the open region of the inhibiting layer; and crystal-growing a functional layer on the Ge layer. This method of manufacturing a semiconductor wafer may further include annealing the crystal-grown Ge layer with a temperature and duration that enables movement of crystal defects and repeating the annealing a plurality of times.

According to a fifth aspect of the invention, provided is a method of manufacturing a semiconductor wafer that includes forming an inhibiting layer that inhibits crystal growth on a principal surface of a silicon wafer; patterning the inhibiting layer to form an opening in the inhibiting layer that passes therethrough in a direction substantially perpendicular to the principal surface of the wafer to expose the wafer; crystal-growing a Ge layer contacting the wafer within the opening; and crystal-growing a functional layer on the Ge layer.

According to a sixth aspect of the invention, provided is a method of manufacturing a semiconductor wafer that includes forming an inhibiting layer that has an opening and that inhibits crystal growth on an Si wafer; forming a Ge layer in the opening; and, after forming the Ge layer, forming a functional layer. Forming the functional layer may include lattice matching or pseudo-lattice matching the functional layer with the Ge layer. The functional layer may be formed within the opening.

The above method of manufacturing a semiconductor wafer may further include annealing the Ge layer with a temperature and duration that enables movement of crystal defects within the Ge layer. The annealing may include annealing the Ge layer at a temperature greater than or equal to 680° C. and less than 900° C. The annealing may include annealing the Ge layer in an atmosphere that contains hydrogen. The annealing may be performed a plurality of times.

In the above method of manufacturing a semiconductor wafer, the Ge layer may be selectively crystal-grown in the opening using a CVD method with a pressure between 0.1 Pa and 100 Pa, inclusive. The Ge layer may be selectively crystal-grown in the opening using a CVD method in an atmosphere that includes raw material gas containing halogen atoms. The method of manufacturing a semiconductor wafer may further include, after forming the Ge layer and before forming the functional layer, forming a GaAs layer at a temperature no greater than 600° C.

The above method of manufacturing a semiconductor wafer may further include, after forming the Ge layer and before forming the functional layer, processing a top surface of the Ge layer with a gas containing P. The functional layer may be a group 3-5 compound layer that includes at least one element selected from a group including Al, Ga, and In as a group 3 element and includes at least one element selected from a group including N, P, As, and Sb as a group 5 element, and the functional layer may be crystal-grown at a growth rate no less than 1 nm/min and no greater than 300 nm/min.

According to a seventh aspect of the invention, provided is an electronic device comprising an Si wafer; an inhibiting layer that is formed on the wafer and that inhibits crystal growth, the inhibiting layer including a covering region that covers a portion of the wafer and an open region that does not cover a portion of the wafer within the covering region; a Ge layer that is crystal-grown in the open region; a functional layer that is crystal-grown on the Ge layer; and an electronic element that is formed on the functional layer. The electronic element may be a heterojunction bipolar transistor, and one electronic element may be formed in each open region. The electronic elements may be connected to each other, or may be connected in parallel. Wiring connected to the electronic element or a bonding pad for the wiring may be formed on the covering region, a plurality of the covering regions and a plurality of the open regions may be formed on the wafer, and the plurality of covering regions and the plurality of open regions are formed at uniform intervals According to an eighth aspect of the invention, provided is an electronic device obtained by forming an inhibiting layer that inhibits crystal growth on a principal surface of a silicon wafer; forming an opening in the inhibiting layer that passes therethrough in a direction substantially perpendicular to the principal surface of the wafer to expose the wafer; crystal-growing a Ge layer contacting the wafer within the opening; crystal-growing a functional layer on the Ge layer; and forming an electronic element on the functional layer.

According to a ninth aspect of the invention, provided is an electronic device comprising an Si wafer; an inhibiting layer that is provided on the Si wafer, has an opening, and inhibits crystal growth; a Ge layer formed in the opening; a functional layer formed after the Ge layer is formed; and an electronic element formed on the functional layer. The functional layer may lattice match or pseudo-lattice match with the Ge layer. The functional layer may be formed within the opening.

In the above electronic device, the inhibiting layer may include a plurality of the openings, and one electronic element may be formed in each opening. The electronic element may be connected to wiring or to a bonding pad, and the wiring or the bonding pad may be formed on the inhibiting layer. The electronic device may include a plurality of the inhibiting layers, and the inhibiting layers may be arranged at uniform intervals.

In the above electronic device, the electronic element may be a heterojunction bipolar transistor. The electronic device may include a plurality of the electronic elements, and the electronic elements may be connected to each other. The electronic device may include a plurality of the electronic elements, and the electronic elements may be connected in parallel.

BRIEF DESCRIPTION OF THE DRAWINGS

FIG. 2 is a magnified view of one of the regions 103.

FIG. 14 shows an exemplary cross-section of a semiconductor wafer 301 according to yet another embodiment of the present invention.

FIG. 15 is an exemplary cross-sectional view of a step for manufacturing the semiconductor wafer 301.

FIG. 19 shows the cross-sectional shape of the Ge layer 120 that is annealed at 800° C.

FIG. 21 shows the cross-sectional shape of the Ge layer 120 that is annealed at 900° C.

FIG. 23 shows a variation coefficient of the thickness of the element formation layers 124 in the First Embodiment.

FIG. 24 shows an average value of the thickness of the element formation layers 124 in the Second Embodiment.

FIG. 31 shows an electron microscope image of an element formation layer 124 in the Third Embodiment.

FIG. 32 shows an electron microscope image of an element formation layer 124 in the Third Embodiment.

FIG. 34 shows an electron microscope image of an element formation layer 124 in the Third Embodiment.

FIG. 36 shows an electron microscope image of an element formation layer 124 in the Fourth Embodiment.

FIG. 40 shows a laser microscope image of the electronic element of the Seventh Embodiment.

LIST OF REFERENCE NUMERALS

Figure 1:
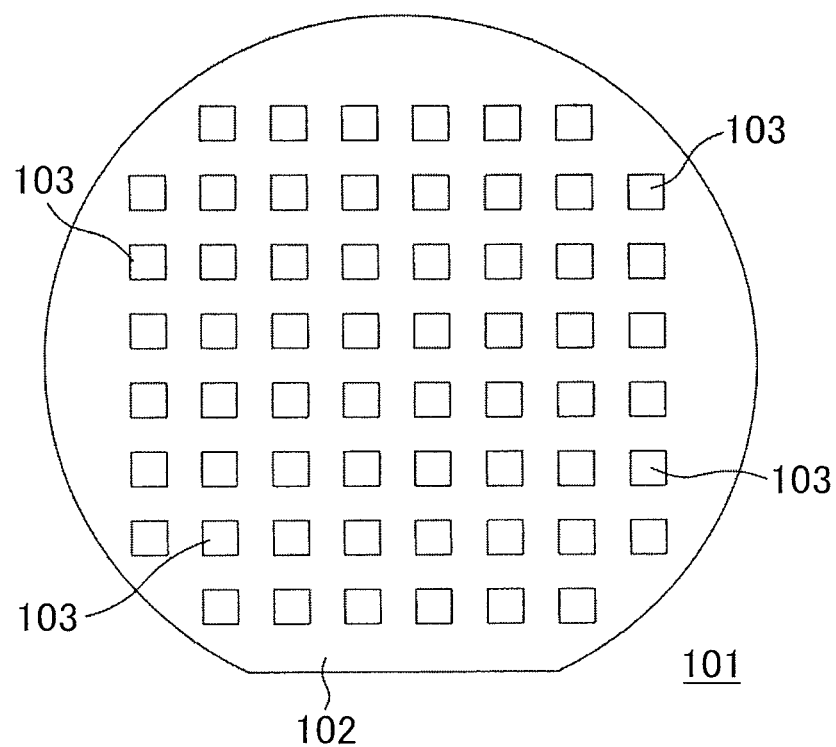
FIG. 1 is an exemplary planar view of a semiconductor wafer 101 according to an embodiment of the present invention.

| | |
|---|---|
| 101 | Semiconductor wafer |
| 102 | Si wafer |
| 103 | Region |
| 104 | Inhibiting layer |
| 106 | Open region |
| 108 | Collector electrode |
| 110 | Emitter electrode |
| 112 | Base electrode |
| 120 | Ge layer |
| 124 | Element formation layer |
| 130 | Silicon oxide layer |
| 140 | Region |
| 142 | Region |
| 201 | Semiconductor wafer |

-continued

LIST OF REFERENCE NUMERALS

| | |
|---|---|
| 202 | GaAs layer |
| 204 | Formation |
| 301 | Semiconductor wafer |
| 302 | Ge layer |

BEST MODE FOR CARRYING OUT THE INVENTION

Hereinafter, some embodiments of the present invention will be described. The embodiments do not limit the invention according to the claims, and all the combinations of the features described in the embodiments are not necessarily essential to means provided by aspects of the invention. FIG. 1 is an exemplary planar view of a semiconductor wafer 101 according to an embodiment of the present invention. The semiconductor wafer 101 of the present invention includes regions 103 in which elements are formed on an Si wafer 102. As shown in FIG. 1, a plurality of the regions 103 are formed at uniform intervals on a top surface of the Si wafer 102. The Si wafer 102 is an example of an Si wafer. The Si wafer 102 may be a commercial Si wafer.

FIG. 2 is a magnified view of one of the regions 103. An inhibiting layer 104 is formed on the region 103. The inhibiting layer 104 is formed on the Si wafer 102, and inhibits crystal growth. One example of crystal growth is epitaxial growth. The inhibiting layer 104 may be an electric insulator. Examples of the inhibiting layer 104 include a silicon oxide layer, a silicon nitride layer, a silicon oxynitride layer, an aluminum oxide layer, and a combination of such layers.

The inhibiting layer 104 includes a covering region that covers a portion of the Si wafer 102 and an open region 106, formed within the covering region, that does not cover the Si wafer 102. Specifically, the region that is a portion of the Si wafer 102 covered by the inhibiting layer 104 is an example of a covering region, and the open region 106 that does not cover the Si wafer 102 is formed in the central portion of the inhibiting layer 104. The area of a single open region 106 is no greater than 1 mm$^2$, for example, and is preferably no greater than 0.25 mm$^2$.

The inhibiting layer 104 has an opening in the open region 106. In this Specification, the "bottom shape" of the opening refers to the shape of the opening on a surface on the wafer side of the layer on which the opening is formed. The bottom shape of the opening may be referred to as the "bottom of the opening." The "planar shape" of the covering region refers to the shape projected by the covering region onto the principal surface of the wafer. The area of the planar shape of the covering region may be referred to as the "area of the covering region." The top surface of the Si wafer 102 is an example of a principal surface of the wafer.

The bottom area of the opening may be no greater than 0.01 mm$^2$, is preferably no greater than 1600 μm$^2$, and more preferably no greater than 900 μm$^2$. If this area is no greater than 0.01 mm$^2$, the amount of time necessary to anneal the Ge layer formed within the opening can be shortened in comparison to the time necessary when this area is greater than 0.01 mm$^2$. If there is a large difference between the thermal expansion coefficients of the functional layer and the wafer, it becomes easy for the thermal annealing to cause localized warping in the functional layer. In this case as well, the occurrence of crystal defects in the functional layer due to warping can be restricted by setting the bottom area of the opening to be no greater than 0.01 mm$^2$.

if the bottom area of the opening is no greater than 1600 μm$^2$, a high-performance device can be manufactured by using a functional layer formed within the opening. If this area is no greater than 900 μm$^2$, these devices can be manufactured with high yield.

Instead, the bottom area of the opening may be greater than or equal to 25 μm$^2$. If this area is less than 25 μm$^2$ and a crystal is epitaxially grown within the opening, the rate of this crystal growth is unstable and disorder in the shape is likely to occur. In addition, if this area is less than 25 μm$^2$, processing of the device becomes more difficult and the yield is decreased, which is unfavorable from an industrial viewpoint. The ratio of the bottom area of the opening to the area of the covering region may be no less than 0.01%. If this ratio is less than 0.01% and a crystal is grown within the opening, the rate of this crystal growth is unstable. When calculating the above ratio, if a plurality of openings are formed within one covering region, the bottom area of the opening refers to the total bottom area of the plurality of openings contained within the covering region.

If the shape of the bottom area of an opening is a square or a rectangle, the length of a side of the bottom area having such a shape may be no greater than 100 μm, preferably no greater than 80 μm, more preferably no greater than 40 μm, and even more preferably no greater than 30 μm. If the length of a side of the bottom area with such a shape is no greater than 100 μm, the amount of time necessary to anneal the Ge layer formed within the opening can be shortened in comparison to the time necessary when this length is greater than 100 μm. Even if there is a large difference between thermal expansion coefficients of the functional layer and the wafer, the occurrence of crystal defects in the functional layer can be restricted.

If the length of a side of the bottom area shape of the opening is no greater than 80 μm, a high-performance device can be formed by using a functional layer formed within the opening. If the length of a side of the bottom area shape is no greater than 40 μm, these devices can be manufactured with high yield. Here, if the bottom area shape of the opening is a rectangle, the "length of a side" referred to above may be the length of a long side.

One opening may be formed within one covering region. As a result, when a crystal is epitaxially grown within the opening, the rate of this crystal growth can be stabilized. Instead, a plurality of openings may be formed within one covering region. In this ease, the openings are preferably arranged at uniform intervals. As a result, when a crystal is epitaxially grown within an opening, the rate of this crystal growth can be stabilized.

If the bottom area shape of an opening is a polygon, the orientation of at least one side of the polygon may be substantially parallel to one crystallographic surface orientation of the principal surface of the wafer. The crystallographic surface orientation may be selected such that a stable surface can be formed on a side of the crystal grown within the opening. Here, the term "substantially parallel" includes cases in which one side of the polygon is slightly skewed from being parallel with one crystallographic surface orientation of the wafer. This skew may be no greater than 5°. In this way, the disorder of the crystal can be restricted so that the crystal can be grown stably. As a result, the crystal can be grown easily and with an ordered shape, thereby achieving a high quality crystal.

The principal surface of the wafer may be the (100) surface, the (110) surface, the (111) surface, or any equivalent surface. The principal surface of the wafer may be skewed slightly from the crystallographic surface orientation described above. In other words, the wafer may have an off angle. This skew may be no greater than 10°. This skew is preferably between 0.05° and 6°, and more preferably between 0.3° and 6°. When growing a rectangular crystal within the opening, the principal surface of the wafer may be the (100) surface, the (110) surface, or any equivalent surface. As a result, the crystal can be easily formed to have a four-fold symmetric surface.

The following describes an example in which the inhibiting layer 104 is formed on the (100) surface of the top surface of the Si wafer 102, the open region 106 is formed in the inhibiting layer 104 and has a bottom shape that is square or rectangular, and a Ge layer 120 and a GaAs crystal, which is an example of the element formation layer 124, are formed within the open region 106. In this case, at least one side of the bottom shape of the open region 106 may be substantially parallel to one of the directions selected from a group including the <010> direction, the <0-10> direction, the <001> direction, and the <00-1> direction of the Si wafer 102. As a result, the side surfaces of the GaAs crystal can be stabilized.

The following describes an example in which the inhibiting layer 104 is formed on the (111) surface of the top surface of the Si wafer 102, the open region 106 is formed in the inhibiting layer 104 and has a bottom shape that is a hexagon, and a Ge layer 120 and a GaAs crystal, which is an example of the element formation layer 124, are formed within the open region 106. In this case, at least one side of the bottom shape of the open region 106 may be substantially parallel to one of the directions selected from a group including the <1-10> direction, the <-110> direction, the <0-11> direction, the <01-1> direction, the <10-1> direction, and the <-101> direction of the Si wafer 102. As a result, the side surfaces of the GaAs crystal can be stabilized. The planar shape of the open region 106 may be an equilateral hexagon. Similarly, instead of a GaAs crystal, a GaN crystal, which is a hexagonal crystal, can be formed.

A plurality of inhibiting layers 104 may be formed on the Si wafer 102. As a result, a plurality of covering regions are formed on the Si wafer 102. An adsorbing section that adsorbs the material of the Ge layer 120 or the element formation layer 124 more quickly than the top surfaces of any of the inhibiting layers 104 may be disposed between one of the inhibiting layers 104 and another inhibiting layer 104 that is adjacent to the one inhibiting layer 104. Each of the inhibiting layers 104 may be surrounded by the adsorbing section. As a result, when a crystal is epitaxially grown within the opening, the rate of this crystal growth can be stabilized. The Ge layer and the functional layer are each an example of the crystal described above.

Each inhibiting layer 104 may include a plurality of openings. The adsorbing section may be included between one of the plurality of openings and another opening adjacent to this one opening. A plurality of the adsorbing sections may be arranged at uniform intervals.

The adsorbing section may be the top surface of the Si wafer 102. The adsorbing section may be a groove that reaches the Si wafer 102. The width of this groove may be between 20 μm and 500 μm. The adsorbing section may be arranged at uniform intervals. The adsorbing section may be a region in which crystal growth occurs.

With chemical vapor deposition (CND) or vapor phase epitaxy (VPE) methods, a raw material gas including constituent elements of the thin film crystal being formed is provided on the wafer, and the thin film is formed by vaporizing the raw material gas or by a chemical reaction with the raw material gas on the top surface of the wafer. The raw material gas supplied in a reaction apparatus generates a reactive intermediate (sometimes referred to hereinafter as a "precursor") through a vapor phase reaction. The generated reactive intermediate is diffused as a gas and adsorbed on the wafer surface. The reactive intermediate adsorbed on the wafer surface is diffused in the wafer surface and deposited as a solid film.

By arranging the adsorbing section between adjacent inhibiting layers 104 or by surrounding inhibiting layers 104 with the adsorbing section, the precursor diffused in the top surface of the covering region can be trapped, adsorbed, or held by the adsorbing section. As a result, when a crystal is epitaxially grown within the opening, the rate of this crystal growth can be stabilized. The precursor is an example of the raw material of the crystal.

In the present embodiment, a covering region with a prescribed size is arranged on the top surface of the Si wafer 102 to cover the top surface of the Si wafer 102. For example, when using the MOCVD method to grow the crystal within the open region 106, a portion of the precursor that has reached the top surface of the Si wafer 102 is grown as a crystal on the top surface of the Si wafer 102. By consuming a portion of the precursor on the top surface of the Si wafer 102 in this way, the crystal formed within the opening can be grown at a stable rate.

Other examples of the adsorbing section include semiconductor materials such as Si and GaAs. For example, by using methods such as ion plating or sputtering on the top surface of the inhibiting layer 104, the adsorbing section can be formed by depositing amorphous semiconductor material or a semiconductor polycrystal. The adsorbing section may be disposed between adjacent inhibiting layers 104, or may be included in the inhibiting layers 104. The same effect can be achieved by arranging a region in which diffusion of the precursor is inhibited between adjacent covering regions or by surrounding the covering regions with regions that inhibit diffusion of the precursor.

If adjacent inhibiting layers 104 are only slightly separated, the rate of the crystal growth can be stabilized. The distance between adjacent inhibiting layers 104 may be no less than 20 μm. As a result, the rate or the crystal growth can be stabilized. Here, the distance between adjacent inhibiting layers 104 refers to the shortest distance between a point on the periphery of an inhibiting layer 104 and a point on the periphery of an adjacent inhibiting layer 104. The plurality of inhibiting layers 104 may be arranged at uniform intervals. In particular, if the distance between adjacent inhibiting layers 104 is less than 10 μm, the rate of the crystal growth within the opening can be stabilized by arranging the inhibiting layers 104 at uniform intervals.

The Si wafer 102 may be a high-resistance wafer that does not include impurities, or may be a low-resistance wafer or mid-resistance wafer that includes positive or negative impurities. The Ge layer 120 may be Ge that does not include impurities, or may be Ge that includes positive or negative impurities.

In the semiconductor wafer 101 of the present embodiment, a HBT (heterojunction bipolar transistor) is formed as an example of an electronic element in the open region 106 shown in FIG. 2. A collector electrode 108 connected to the collector of the HBT, an emitter electrode 110 connected to the emitter of the HBT, and a base electrode 112 connected to the base of the HBT are formed on the inhibiting layer 104 of the covering region that surrounds the open region 106.

In other words, electrodes connected to the HBT, which is an example of an electronic element, are formed on the covering region. The electrodes can be replaced by wiring or a wiring bonding pad. An HBT, which is an example of an electronic element, may be formed in each open region 106. The electronic elements exemplified by the HBTs may be connected to each other, or may be connected in parallel.

Figure 3:
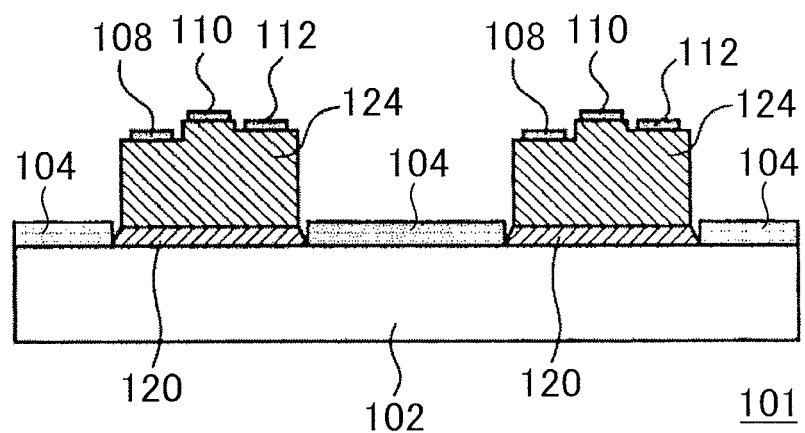
FIG. 3 is a cross-sectional view of the semiconductor wafer 101 together with an HBT formed in the open region 106 of the covering region covered by the inhibiting layer 104.

FIG. 3 is a cross-sectional view of the semiconductor wafer 101 together with an HBT formed in the open region 106 of the covering region covered by the inhibiting layer 104. The semiconductor wafer 101 includes the Si wafer 102, the inhibiting layer 104, the Ge layer 120, and the element formation layer 124. The HBT is formed as an electronic element on the element formation layer 124. In the present embodiment, the HBT is provided as an example of an electronic element formed on the element formation layer 124, but the electronic element is not limited to this. For example, other electronic elements such as a light emitting diode, an HEMT (High Electron Mobility Transistor), a solar battery, and a thin film sensor may be formed.

A collector mesa, an emitter mesa, and a base mesa of the HBT are formed on the top surface of the element formation layer 124. The collector electrode 108, the emitter electrode 110, and the base electrode 112 are formed on the top surfaces of the collector mesa, the emitter mesa, and the base mesa via contact holes. A collector layer, an emitter layer, and a base layer of the HBT are included in the element formation layer 124.

One example of the collector layer is a layered thin film obtained by layering, in the stated order from the wafer, an n$^+$GaAs layer with a carrier concentration of $3.0 \times 10^{18}$ cm$^{-3}$ and a thickness of 500 nm and an n$^-$GaAs layer with a carrier concentration of $1.0 \times 10^{16}$ cm$^{-3}$ and a thickness of 500 μm. One example of the base layer is a p$^-$GaAs layer with a carrier concentration of $5.0 \times 10^{19}$ cm$^{-3}$ and a thickness of 50 nm. One example of the emitter layer is a layered thin film obtained by layering, in the stated order from the wafer, an n$^-$InGaP layer with a carrier concentration of $3.0 \times 10^{11}$ cm$^3$ and a thickness of 30 μm, an n$^+$GaAs layer with a carrier concentration of $3 \times 10^{18}$ cm$^{-3}$ and a thickness of 100 nm, and an n$^+$InGaAs layer with a carrier concentration of $1.0 \times 10^{19}$ cm$^{-3}$ and a thickness of 100 nm.

The Si wafer 102 and the inhibiting layer 104 may be as described above. The Ge layer 120 is crystal-grown in the open region 106 of the inhibiting layer 104. The crystal growth may be performed selectively. One example of crystal growth is epitaxial growth. In other words, when epitaxially growing the Ge layer 120, the Ge layer 120 is not formed on the surface of the inhibiting layer 104 since the inhibiting layer 104 inhibits epitaxial growth, but the Ge layer is epitaxially grown on the Si wafer 102 in the open region 106, which is not covered by the inhibiting layer 104. The Ge layer 120 can be annealed with a temperature and duration that enables movement of crystal defects, and the annealing can be repeated multiple times.

The Ge layer 120 may be annealed at a temperature below 900° C., preferably 850° C. or lower. As a result, the top surface of the Ge layer 120 can be kept flat. The flatness of the top surface of the Ge layer 120 is particularly important when timing another layer on the top surface of the Ge layer 120. The Ge layer 120 may be annealed at a temperature of 680° C. or higher, preferably 700° C. or higher. As a result, the density of the crystal defects in the Ge layer 120 can be decreased. The Ge layer 120 may be annealed at a temperature that is greater than or equal to 680° C. and below 900° C.

Figure 17:
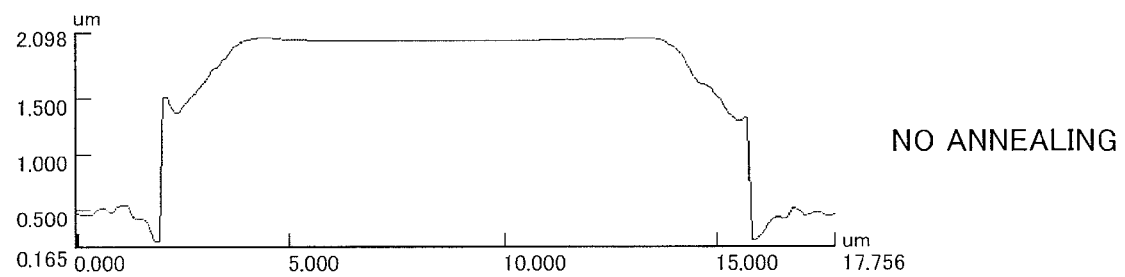
FIG. 17 shows the cross-sectional shape of the Ge layer 120 that is not annealed.
Figure 18:
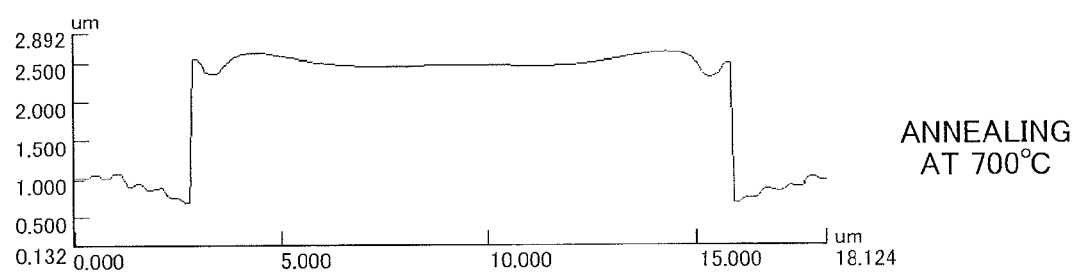
FIG. 18 shows the cross-sectional shape of the Ge layer 120 that is annealed at 700° C.
Figure 20:
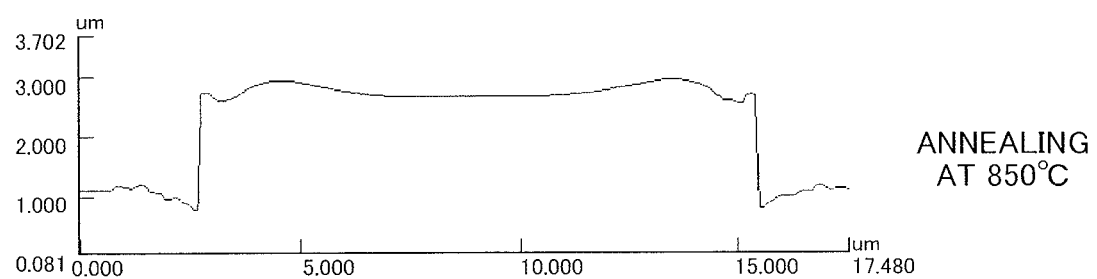
FIG. 20 shows the cross-sectional shape of the Ge layer 120 that is annealed at 850° C.

FIGS. 17 to 21 show a relationship between the annealing temperature and the flatness of the Ge layer 120. FIG. 17 shows the cross-sectional shape of the Ge layer 120 that is not annealed. FIGS. 18 to 21 respectively show cross-sectional shapes of the Ge layer 120 after being annealed at temperatures of 700° C., 800° C., 850° C., and 900° C. The cross-sectional shape of the Ge layer 120 can be observed by a laser microscope. The vertical axis in each of these Figures represents the distance in a direction perpendicular to the principal surface of the Si wafer 102, and shows the thickness of the Ge layer 120. The horizontal axis in each of these Figures represents the distance in a direction parallel to the principal surface of the Si wafer 102.

In each of these Figures, the Ge layer 120 was formed according to the following steps. First, the thermal oxidation method was used to form the inhibiting layer 104 as an SiO$_2$ layer on the top surface of the Si wafer 102, and the covering region and the open region 106 were formed on the inhibiting layer 104. The Si wafer 102 was a commercial single-crystal Si wafer. The planar shape of the covering region was a square in which each side had a length of 400 μm. Next, the CVD method was used to selectively grow the Ge layer 120 within the open region 106.

Based on FIGS. 17 to 21, it is understood that lower annealing temperatures lead to favorable flatness of the top surface of the Ge layer 120. The top surface of the Ge layer 120 exhibits especially good flatness when the annealing temperature is below 900° C.

The Ge layer 120 may be annealed in an ambient atmosphere, a nitrogen atmosphere, an argon atmosphere, or a hydrogen atmosphere. In particular, by annealing the Ge layer 120 in an atmosphere that includes hydrogen, the top surface of the Ge layer 120 can be maintained in a smooth state while decreasing the density of crystal defects in the Ge layer 120.

The Ge layer 120 may be annealed with a temperature and duration that enables movement of crystal defeats. The crystal defects in the Ge layer 120 move within the Ge layer 120 during the annealing, and are trapped in the interface between the Ge layer 120 and the inhibiting layer 104, in the top surface of the Ge layer 120, or in a gettering sink within the Ge layer 120, for example. As a result, the crystal defects near the top surface of the Ge layer 120 can be expelled. The interface between the Ge layer 120 and the inhibiting layer 104, the top surface of the Ge layer 120, and the gettering sink within the Ge layer 120 are each an example of a defect trapping section that traps crystal defects that can move within the Ge layer 120.

The defect trapping section may be a top surface or an interface with the crystal, or may be a physical flaw. The defect trapping section may be arranged at a distance that enables movement of the crystal defects for the temperature and duration conditions of the annealing.

The Ge layer 120 is an example of a seed layer that provides a seed surface for the functional layer. Another example of a seed surface include Si$_x$Ge$_{1-x}$ where $0 \leq x < 1$. The annealing may be performed in two stages including a high-temperature annealing for 2 to 10 minutes at a temperature between 800° C. and 900° C., and low-temperature annealing for 2 to 10 minutes at a temperature between 680° C. and 780° C.

The Ge layer 120 may be selectively crystal-grown in the open region 106. The Ge layer 120 can be formed using methods such as CVD and MBE (Molecular Beam Epitaxy), for example. The raw material gas may be GeH$_4$. The Ge layer 120 can be formed using the CVD method with a pressure no less than 0.1 Pa and no greater than 100 Pa. Therefore, the growth rate of the Ge layer 120 is not affected by the area of the open region 106. As a result, the uniformity of the thickness of the Ge layer 120 can be improved, for example. In this case, the deposition of Ge crystals on the top surface of the inhibiting layer 104 can be restricted.

The Ge layer 120 may be formed using the CVD method in an atmosphere that includes raw material gas containing halogen atoms. The gas containing halogen atoms may be a hydrogen chloride gas or a chlorine gas. As a result, the deposition of Ge crystals on the top surface of the inhibiting layer 104 is restricted even when the Ge layer 120 is formed using the CVD method with a pressure of no less than 100 Pa.

The present embodiment describes an example in which the Ge layer 120 is formed contacting the top surface of the Si wafer 102, but the present invention is not limited to this. For example, another layer may be arranged between the Ge layer 120 and the Si wafer 102. This other layer may be a single layer or may include a plurality of layers.

The Ge layer 120 may be formed according to the following steps. First, a seed crystal is formed at a low temperature. The seed crystal may be $Si_xGe_{1-x}$, where $0 \leq x < 1$. The temperature at which the seed crystal is grown may be no less than 330° C. and no greater than 450° C. After this, the temperature of the Si wafer 102 on which the seed crystal is formed is raised to a prescribed temperature, after which the Ge layer 120 may be formed.

The element formation layer 124 is an example of a functional layer. The HBT, which is an example of an electronic element, may be formed on the element formation layer 124 as described above. The element formation layer 124 may be formed to contact the Ge layer 120. In other words, the element formation layer 124 may be crystal-grown on the Ge layer 120. One example of crystal growth is epitaxial growth.

The element formation layer 124 may be a group 3-5 compound layer or a group 2-6 compound layer that lattice matches or pseudo-lattice matches with Ge. The element formation layer 124 may be a group 3-5 compound layer that lattice matches or pseudo-lattice matches with Ge, in which the group 3 element includes at least one of Al, Ga, and In and the group 5 element includes at least one of N, P, As, and Sb. For example, the element formation layer 124 may be a GaAs layer. Pseudo-lattice matching means that there is only a small difference between the lattice constants of the two semiconductor layers in contact with each other, and so, although this is not complete lattice matching, the lattice matching is close enough that the occurrence of defects due to lattice mismatching is negligible, and so these two contacting semiconductor layers can be considered to be in a layered state. For example, the layered state of the Ge layer and the GaAs layer can be considered as pseudo-lattice matching.

The element formation layer 124 may have an arithmetic mean roughness value (sometimes referred to hereinafter as the "Ra value") that is no greater than 0.02 μm, preferably no greater than 0.01 μm. As a result, a high-performance device can be formed using the element formation layer 124. Here, the Ra value is an indicator of the surface roughness, and can be calculated according to JIS B0601-2001. The Ra value can be obtained by dividing (i) the area between a roughness curve and a central line over a prescribed length by (ii) the measured length.

The growth rate of the element formation layer 124 may be no greater than 300 μm/min, preferably no greater than 200 nm/min, and more preferably no greater than 60 nm/min. As a result, the Ra value of the element formation layer 124 can be held at 0.02 μm or less. The growth rate of the element formation layer 124 may be no less than 1 nm/min, preferably no less than 5 nm/min. As a result, a high-quality element formation layer 124 can be achieved without sacrificing the rate of production. For example, the element formation layer 124 may be crystal-grown with a rate between 1 nm/min and 300 nm/min, inclusive.

The present embodiment describes an example in which the element formation layer 124 is formed on the top surface of the Ge layer 120, but the present invention is not limited to this. For example, an intermediate layer may be arranged between the Ge layer 120 and the element formation layer 124. This intermediate layer may be a single layer or may include a plurality of layers. The intermediate layer may be formed at a temperature no greater than 600° C., preferably no greater than 550° C. As a result, the crystallinity of the element formation layer 124 can be improved. The intermediate layer may be formed at a temperature no less than 400° C. The intermediate layer may be formed at a temperature between 400° C. and 600° C., inclusive. As a result, the crystallinity of the element formation layer 124 can be improved. The intermediate layer may be a GaAs layer formed at a temperature no greater than 600° C., preferably no greater than 550° C.

The element formation layer 124 may be formed according to the following steps. First, the intermediate layer is formed on the top surface of the Ge layer 120. The temperature at which the intermediate layer is grown may be no greater than 600° C. After this, the temperature of the Si wafer 102 on which the intermediate layer is formed is raised to a prescribed temperature, after which the element formation layer 124 may be formed.

Figure 4:
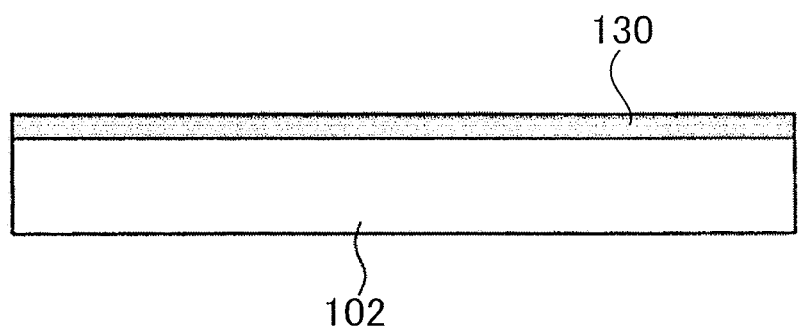
FIG. 4 is an exemplary cross-sectional view of a step for manufacturing the semiconductor wafer 101.

FIGS. 4 to 8 are exemplary cross-sectional views of steps for manufacturing the semiconductor wafer 101. As shown in FIG. 4, the Si wafer 102 is prepared and silicon oxide layer 130, for example, is formed on the top surface of the Si wafer 102 to serve as the inhibiting layer. The silicon oxide layer 130 may be formed using the thermal oxidation method. The thickness of the silicon oxide layer 130 may be 1 μm.

Figure 5:
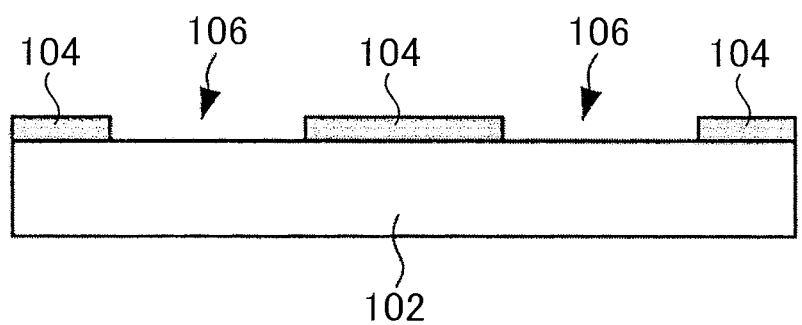
FIG. 5 is an exemplary cross-sectional view of a step for manufacturing the semiconductor wafer 101.

As shown in FIG. 5, the silicon oxide layer 130 is patterned to form the inhibiting layer 104. By forming the inhibiting layer 104, the open region 106 is also formed. The patterning may be achieved by photolithography, for example.

Figure 6:
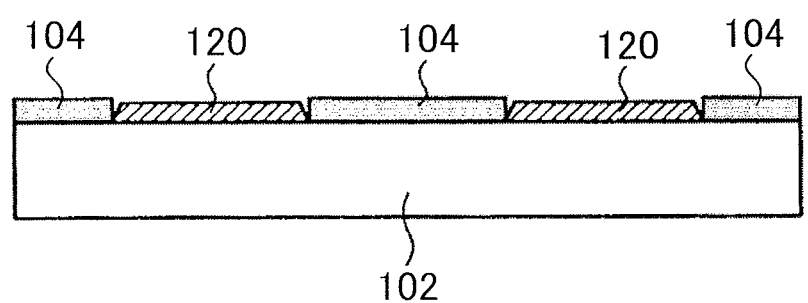
FIG. 6 is an exemplary cross-sectional view of a step for manufacturing the semiconductor wafer 101.

As shown in FIG. 6, the Ge layer 120 is epitaxially grown, for example, in the open region 106. The epitaxial growth of the Ge layer 120 may be achieved using methods such as MOCVD (Metal Organic Chemical Vapor Deposition) and MBE (Molecular Beam Epitaxy). The raw material gas may be $GeH_4$.

Figure 7:
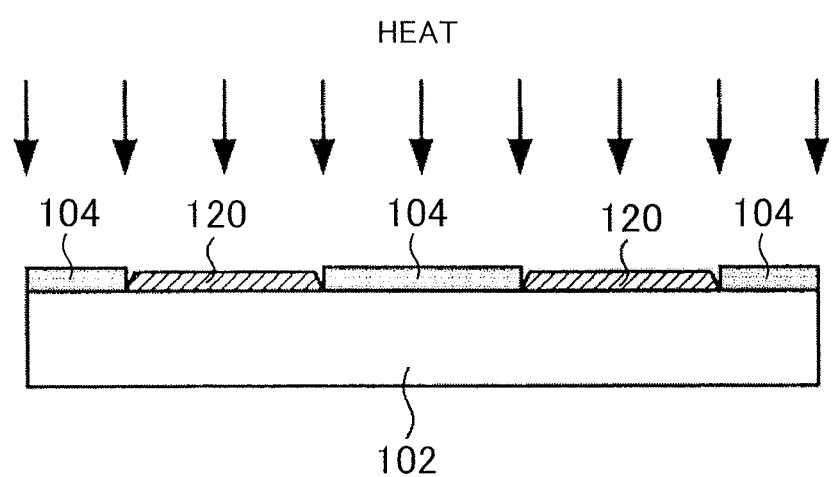
FIG. 7 is an exemplary cross-sectional view of a step for manufacturing the semiconductor wafer 101.

As shown in FIG. 7, the epitaxially grown Ge layer 120 is thermally annealed. The thermal annealing may be performed in two stages including a high-temperature annealing at a temperature below the melting point of Ge and low-temperature annealing at a temperature lower than the temperature of the high-temperature annealing. The two-stage annealing can be repeated multiple times. The duration and temperature of the high-temperature annealing may be 10 minutes at 900° C., and the duration and temperature of the low-temperature annealing may be 10 minutes at 780° C. The number of repetitions of this annealing may be 10.

In the present embodiment, the two-stage annealing is repeated multiple times after the Ge layer 120 is epitaxially grown, for example. Therefore, the crystal defects that are present during the epitaxial growing can be moved to the edges of the Ge layer 120 by the annealing, and the density of the crystal defects in the Ge layer 120 can then be reduced to a very low level by expelling the moved crystal defects from the edges of the Ge layer 120. As a result, the defects caused by wafer materials of an epitaxial thin film to be formed later, for example, can be decreased, thereby improving the capabilities of the electronic elements formed on the element formation layer 124. Furthermore, even if there is a type of thin film that cannot be crystal-grown directly on the wafer due to lattice mismatching, a high quality crystal thin film can be formed having a Ge layer 120 with superior crystallinity as the wafer material.

Figure 8:
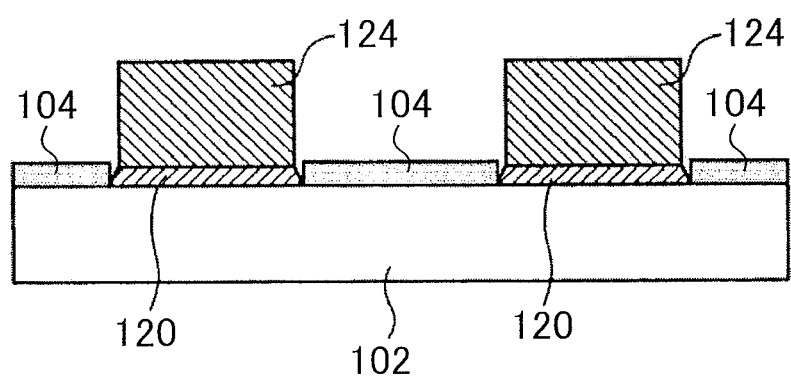
FIG. 8 is an exemplary cross-sectional view of a step for manufacturing the semiconductor wafer 101.

As shown in FIG. 8, the element formation layer 124 is epitaxially grown, for example, on the Ge layer 120. The element formation layer 124 may be a GaAs-type layered film that includes a GaAs layer or an InGaAs layer, for example. The epitaxial growth of the GaAs layer or the GaAs-type layered film can be achieved using methods such as MOCVD and MBE, for example.

The raw material gas may be TM-Ga (trimethylgallium), AsH$_3$ (arsine), or some other gas. The growth temperature may be between 600° C. and 650° C. Since the inhibiting layer 104 inhibits growth during the epitaxial growth of the GaAs layer or the like, the GaAs layer or the like can be selectively formed on the Ge layer 120 without being formed on the inhibiting layer 104.

After this, if an electronic element such as an HBT is formed on the element formation layer 124 using a known method, the semiconductor wafer 101 shown in FIG. 3 can be obtained. With the method described above, the semiconductor wafer 101 of the present embodiment can be manufactured. The following describes experimental results for semiconductor wafers 101 that were actually formed using the above method.

Figure 9:
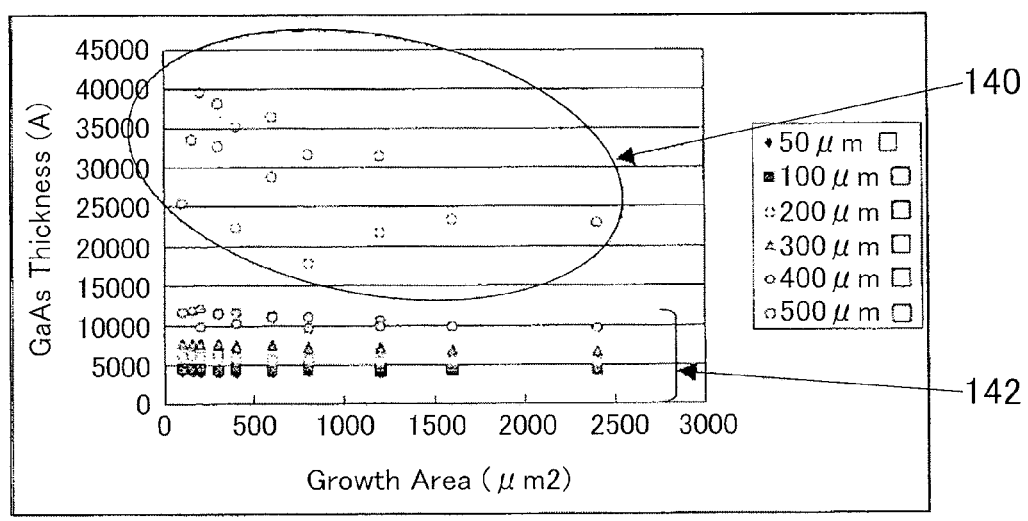
FIG. 9 is a graph showing results concerning the thickness of the element formation layer 124 formed during a prescribed epitaxial growth time relative to the area of the open region 106, in series according to the area of covering regions.

FIG. 9 is a graph showing experimental results concerning the thickness of the element formation layer 124 formed during a prescribed epitaxial growth time with respect to the area of the open region 106, for a series of different areas of covering regions formed at intervals of 500 µm. The vertical axis represents the thickness of the element formation layer 124, but since this is a thickness obtained over a prescribed growth time, this axis can instead represent the growth rate of the element formation layer 124. Based on FIG. 9, it is understood that larger covering regions lead to faster growth rates. This indicates that the growth rate increases, i.e. the raw material efficiency increase, by concentrating the raw material in the open region 106 without growing the crystal in the covering region.

In FIG. 9, the points plotted in the region 140 indicate cases in which the covering region was 500 µm□, and this shows that the growth rate of the element formation layer 124 was unstable. Since the covering regions are formed at intervals of 500 µm as described above, adjacent covering regions become connected to each other when the covering regions are 500 µm□. This case is undesirable since the growth rate is unstable. The covering regions are preferably arranged with space therebetween. On the other hand, when the covering regions are from 50 µm□ to 400 µm□ apart, as shown in the region 142, the growth rate of the element formation layers 124 is stable and does not depend on the area of the covering regions.

The dependency on the area of the open region 106 was not very large, but an increase in the area of the open region 106 leads to a drop in the growth rate. On the other hand, the increase of the growth rate that accompanies the increased size of the covering regions is relatively clear, and as a result, the precursor of the crystal whose growth is inhibited in the covering region migrates to the open region 106, and the crystal precursor that reaches the open region 106 contributes to the thin film growth.

As described above, the Ge layer 120 is selectively grown in the open region 106 defined by the inhibiting layer 104, and the crystallinity of the Ge layer 120 can be increased by repeatedly applying two-stage annealing to the Ge layer 120. Since the semiconductor wafer 101 uses an Si wafer 102, the semiconductor wafer 101 can be manufactured at a low cost and the heat generated by the electronic elements formed on the element formation layer 124 can be efficiently released.

Figure 10:
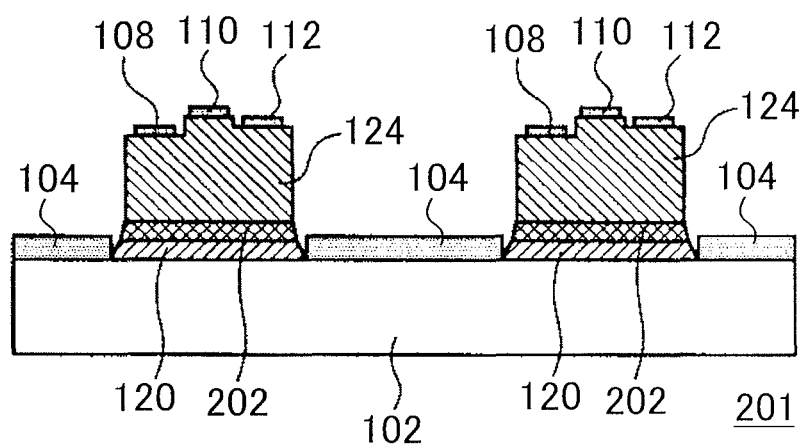
FIG. 10 shows an exemplary cross-section of a semiconductor wafer 201 according to another embodiment of the present invention.

FIG. 10 shows an exemplary cross-section of a semiconductor wafer 201 according to another embodiment of the present invention. The semiconductor wafer 201 is the same as the semiconductor wafer 101 except that the semiconductor wafer 201 includes a GaAs layer 202 formed at a temperature no greater than 500° C. The following describes only points that differ from the semiconductor wafer 101.

Figure 11:
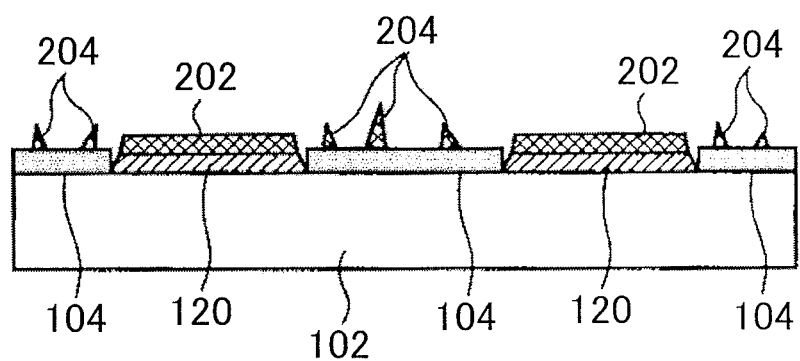
FIG. 11 is an exemplary cross-sectional view of a step for manufacturing the semiconductor wafer 201.
Figure 12:
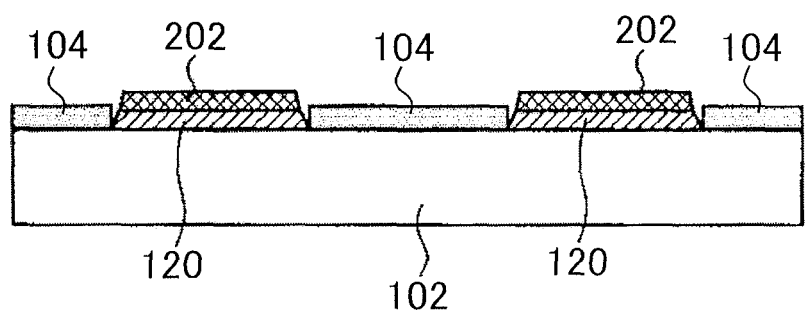
FIG. 12 is an exemplary cross-sectional view of a step for manufacturing the semiconductor wafer 201.

FIGS. 11 and 12 are exemplary cross-sectional views of steps for manufacturing the semiconductor wafer 201. The manufacturing steps of the semiconductor wafer 201 up through the formation of the Ge layer 120 are the same as the manufacturing steps of the semiconductor wafer 101 up through FIG. 7.

As shown in FIG. 11, the GaAs layer 202 is formed after formation of the Ge layer 120. The GaAs layer 202 may be formed at a temperature no greater than 500° C., as described above. The formation of the GaAs layer 202 can be achieved using methods such as MOCVD and MBE, for example. The raw material gas may be TE-Ga (triethylgallium), AsH$_3$ (arsine), or some other gas. The growth temperature may be 450° C.

The GaAs layer 202 is formed at a low temperature in the present embodiment. Therefore, the function of the inhibiting layer 104 is not completely effective, and so a GaAs formation 204 is deposited on the top surface of the inhibiting layer 104. This formation 204 can be removed by various etching methods, and is removed as shown in FIG. 12. The following steps are the same as those performed for the semiconductor wafer 101.

Figure 13:
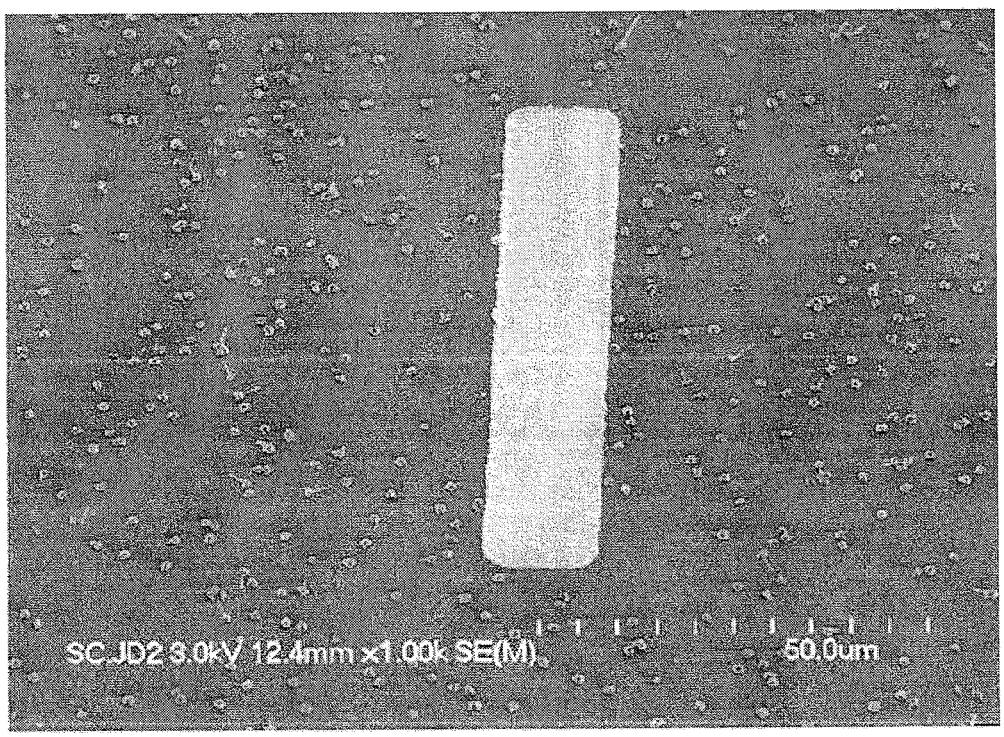
FIG. 13 is an SEM image of the top surface after formation of the GaAs layer 202 at a temperature no greater than 500° C.

FIG. 13 is an SEM image of the top surface after formation of the GaAs layer 202 at a temperature no greater than 500° C. The GaAs layer 202 is formed in the open region at the center, and formations are deposited on the top surface of the inhibiting layer around the GaAs layer 202. It should be noted that the deposited formations can be removed by etching, as described above.

In the semiconductor wafer 201, the GaAs layer 202 is firmed at a temperature no greater than 500° C. Even though the GaAs layer 202 is grown at a low temperature, the crystallinity of the element formation layer 124 is somewhat improved. Therefore, in the same way as the semiconductor wafer 101, the semiconductor wafer 201 can be provided at low cost and a high-performance electronic element can be formed on the element formation layer 124.

FIG. 14 shows an exemplary cross-section of a semiconductor wafer 301 according to yet another embodiment of the present invention. The semiconductor wafer 301 is the same as the semiconductor wafer 101 except that a surface of the Ge layer 302 facing the element formation layer 124 in the semiconductor wafer 301 undergoes surface processing with a gas including P. The following describes only points that differ from the semiconductor wafer 101.

FIG. 15 is an exemplary cross-sectional view of a step for manufacturing the semiconductor wafer 301. The manufacturing steps of the semiconductor wafer 301 up through the formation of the Ge layer are the same as the manufacturing steps of the semiconductor wafer 101 up through FIG. 7. As shown in FIG. 15, after the Ge layer 302 is formed, the top surface of the Ge layer 302 is exposed to PH$_3$, for example. By processing the top surface of the Ge layer 302 with PH$_3$, the crystal quality of the GaAs layer grown thereon can be increased.

The temperature for the PH$_3$ processing is preferably between 500° C. and 900° C., inclusive, for example. Higher or lower temperatures are undesirable because the effect of the processing does not appear at temperatures below 500° C. and the properties of the Ge layer 302 change at temperatures above 900° C. A more preferable processing temperature range is from 600° C. to 800° C., inclusive. The exposure process may involve activating $PH_3$ with plasma or the like. The following steps are the same as those performed for the semiconductor wafer 101.

In the same manner as in the semiconductor wafer 101, an intermediate layer may be arranged between the Ge layer 302 and the element formation layer 124 in the semiconductor wafer 301. This intermediate layer may be a single layer or may include a plurality of layers. The intermediate layer may be formed at a temperature no greater than 600° C., preferably no greater than 550° C. As a result, the crystallinity of the element formation layer 124 can be improved. The intermediate layer may be a GaAs layer formed at a temperature no greater than 600° C., preferably no greater than 550° C. The intermediate layer may be formed at a temperature no less than 400° C. In this case, the surface of the Ge layer 302 that faces the intermediate layer may be surface processed with the gas including P.

Figure 16:
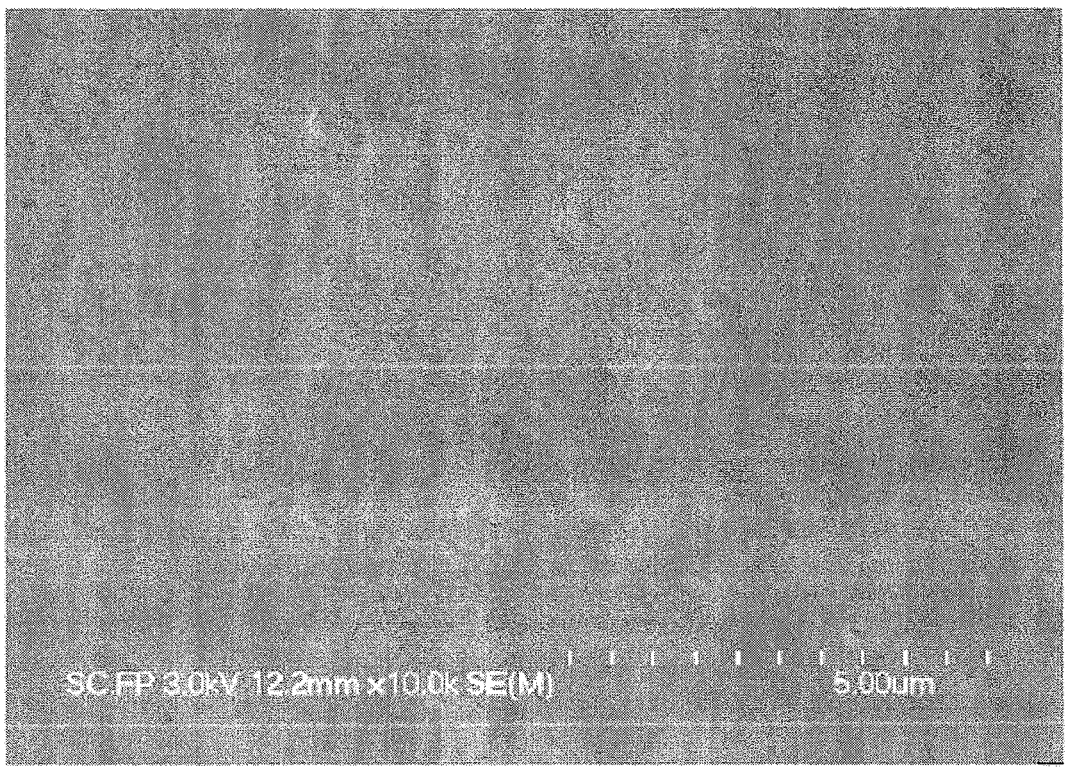
FIG. 16 is an SEM image of a top surface in a case where the element formation layer 124 is a GaAs layer.

FIG. 16 is an SEM image of a top surface in a case where the GaAs layer is formed as the element formation layer 124. Almost no bumps or valleys to the order of μm can be seen on the surface, and this means that there is an extremely low level of crystal defects. When the Ge layer 302 was surface processed with a raw material gas including P, as in the semiconductor wafer 301, a GaAs layer with good crystallinity was formed as the element formation layer 124. Therefore, in the same way as the semiconductor wafer 101, the semiconductor wafer 301 can be provided at low cost and a high-performance electronic element can be formed on the element formation layer 124.

[Embodiments]

(First Embodiment)

A semiconductor wafer including an Si wafer 102, an inhibiting layer 104, a Ge layer 120, and an element formation layer 124 was formed, and a relationship between (i) the growth rate of the crystal grown within an opening formed by the inhibiting layer 104 and (ii) the size of a covering region and the size of the opening was examined. The experimentation involved changing the bottom shape of the opening and the planar shape of the covering region formed on the inhibiting layer 104 and measuring the thickness of an element formation layer 124 that is grown over a prescribed time.

First, the covering region and the opening were formed on the top surface of the Si wafer 102 according to the following steps. A commercial single-crystal Si wafer was used as an example of the Si wafer 102. The thermal oxidation method was used to form an $SiO_2$ layer on the top surface of the Si wafer 102, as an example of the inhibiting layer 104.

The $SiO_2$ layer was etched to be a prescribed size. More than two $SiO_2$ layers of the prescribed size were formed. At this time, the planar shapes of the $SiO_2$ layers having the prescribed size were designed to each be squares of the same size. Etching was then used to form an opening with a prescribed size in the center of each square $SiO_2$ layer. At this time, the square $SiO_2$ layers were each designed such that the center of the $SiO_2$ layer matches the center of the opening. One opening was formed in each square $SiO_2$ layer. In this Specification, the length of a side of a square $SiO_2$ layer may be referred to as the "length of a side of the covering region."

Next, the MOCVD method was used to selectively grow the Ge layer 120 within the opening. The raw material gas was $GeH_4$. The flow rate and deposition time of the raw material gas were each set to a prescribed value. Next, the MOCVD method was used to form the GaAs crystal, which is an example of the element formation layer 124. The GaAs crystal was epitaxially grown on the top surface of the Ge layer 120 within the opening under conditions of 620° C. and 8 MPa. The raw material gas used was trimethylgallium. The flow rate and deposition time of the raw material gas were each set to a prescribed value.

After formation of the element formation layer 124, the thickness of the element Formation layer 124 was measured. The thickness of the element formation layer 124 was calculated by using a surface profiler (Surface Profiler P-10 manufactured by KLA Tencor) to measure the thickness at three points of the element formation layer 124 and calculating the average thickness of these three points. At this time, the standard deviation of the thickness at the three points was also calculated. This thickness may instead be calculated by using a transmission electron microscope or a scanning electron microscope to directly measure the thickness at three points of the element formation layer 124 according to a cross-section observation method, and calculating the average thickness of these three points.

As a result of the above steps, the thickness of the element formation layer 124 was measured while changing the bottom shape of the opening when the length of a side of the covering region is set to be 50 μm, 100 μm, 200 μm, 300 μm, 400 μm, and 500 μm, respectively. Experimentation was performed for three bottom shapes of the opening, which are a square in which a side is 10 μm, a square in which a side is 20 μm, and a rectangle in which a short side is 30 μm and a long side is 40 μm.

When the length of a side of the covering region is 500 μm, a plurality of the square $SiO_2$ layers are formed integrally. When this happens, it is not the case that covering regions with a side length of 500 μm are arranged at intervals of 500 μm, but for ease of explanation, the explanation will deal with a case where the length of a side of each covering region is 500 μm. Furthermore, for ease of explanation, the distance between adjacent covering regions is treated as being 0 μm.

Figure 22:
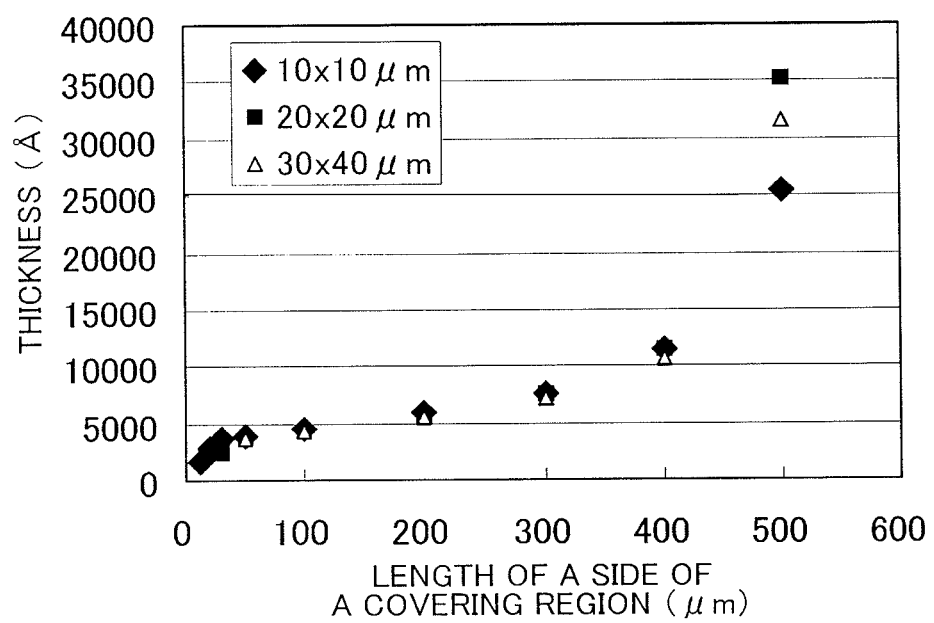
FIG. 22 shows an average value of the thickness of the element formation layers 124 in the First Embodiment.
Figure 25:
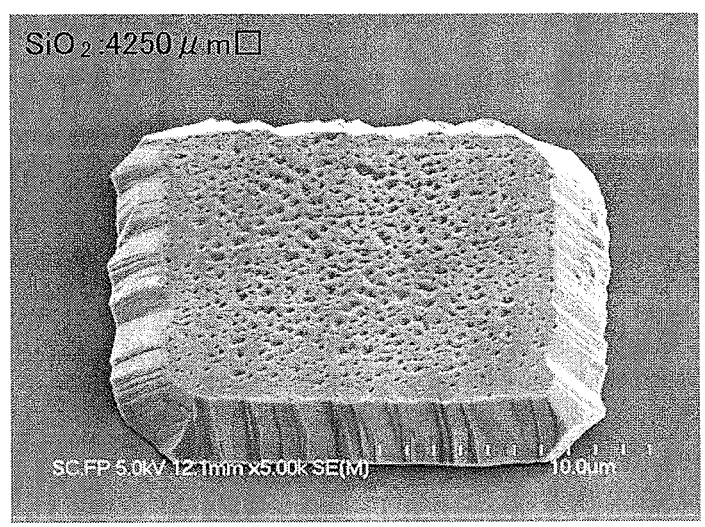
FIG. 25 shows an electron microscope image of an element formation layer 124 in the Second Embodiment.
Figure 26:
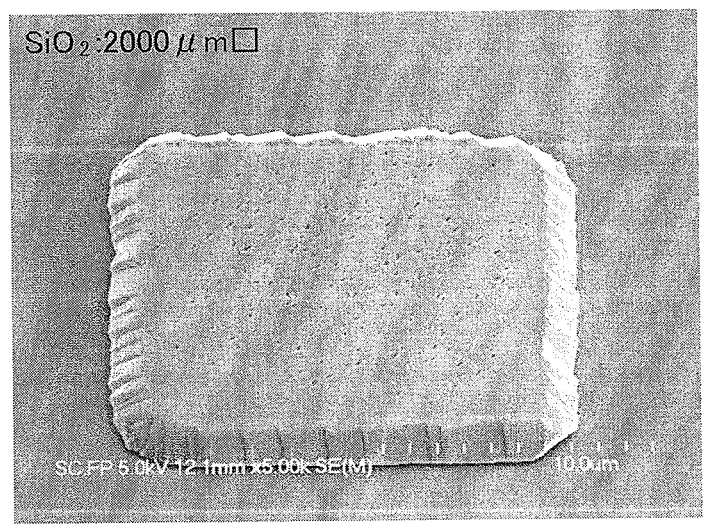
FIG. 26 shows an electron microscope image of an element formation layer 124 in the Second Embodiment.
Figure 27:
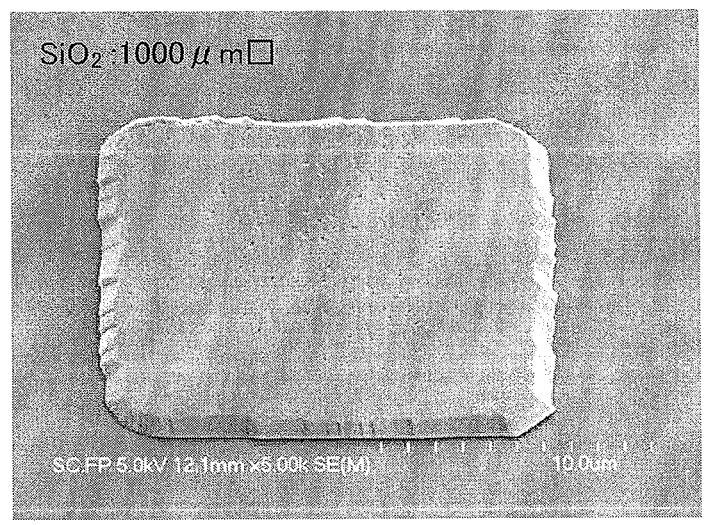
FIG. 27 shows an electron microscope image of an element formation layer 124 in the Second Embodiment.
Figure 28:
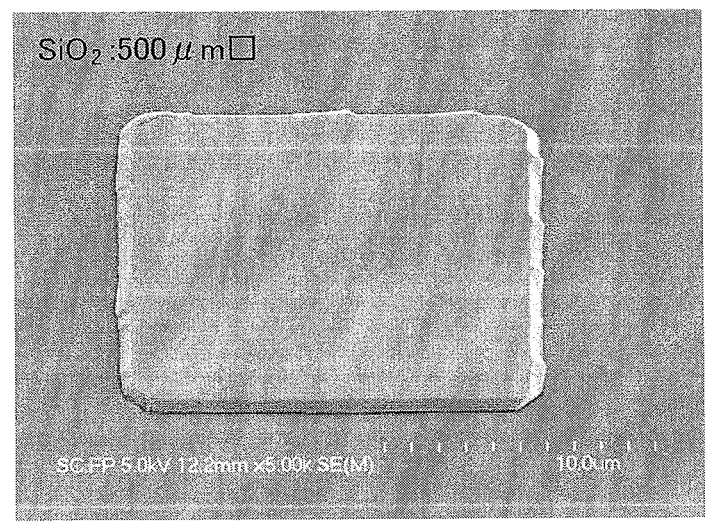
FIG. 28 shows an electron microscope image of an element formation layer 124 in the Second Embodiment.
Figure 29:
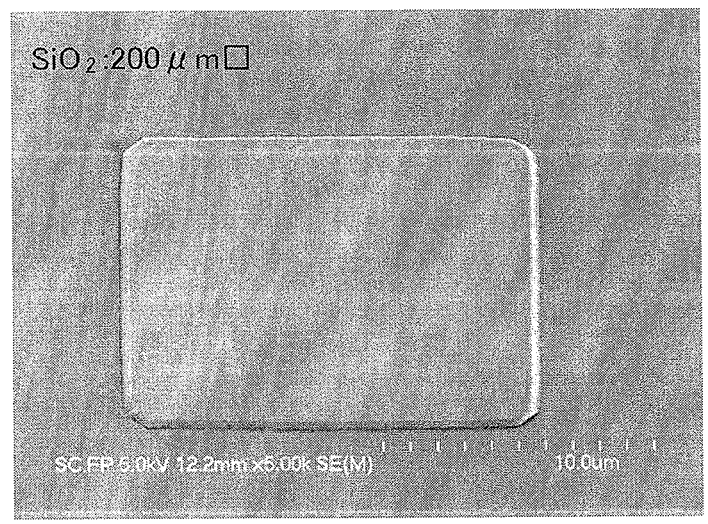
FIG. 29 shows an electron microscope image of an element formation layer 124 in the Second Embodiment.
Figure 30:
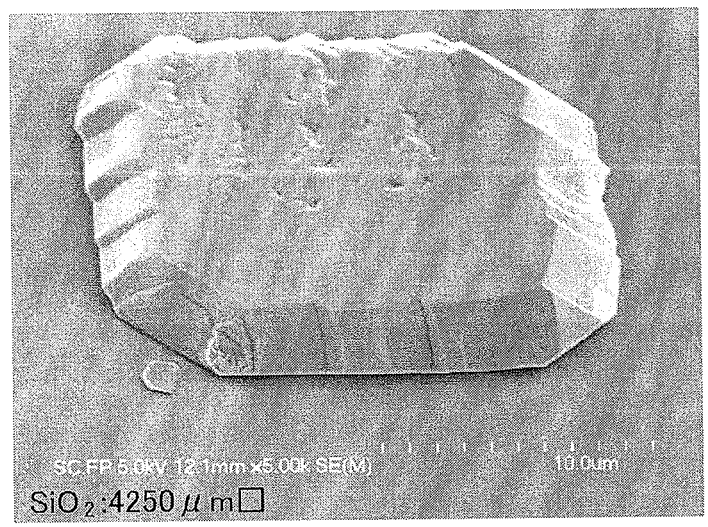
FIG. 30 shows an electron microscope image of an element formation layer 124 in the Third Embodiment.
Figure 33:
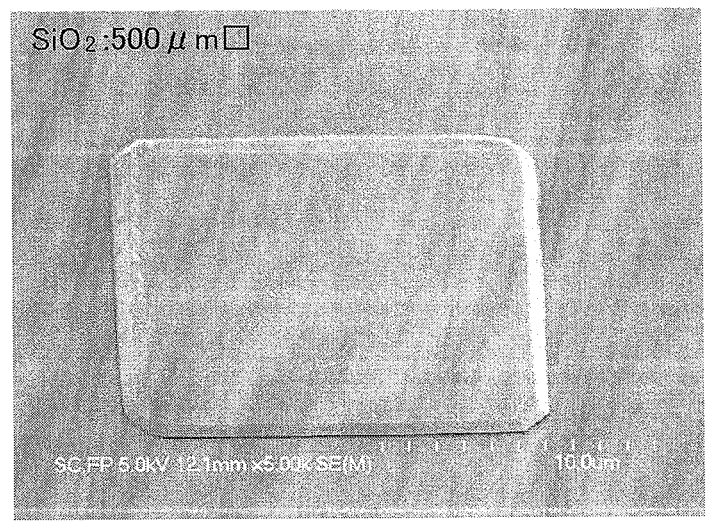
FIG. 33 shows an electron microscope image of an element formation layer 124 in the Third Embodiment.

The experimental results for the First Embodiment are shown in FIGS. 22 and 23. FIG. 22 shows an average value of the thickness of the element formation layer 124 for each wafer according to the First Embodiment. FIG. 23 shows a variation coefficient for the thickness of the element formation layer 124 for each wafer according to the First Embodiment.

FIG. 22 shows the relationship between the growth rate of the element formation layer 124 and the sizes of the covering region and the opening. In FIG. 22, the vertical axis represents the thickness (Å) of the element formation layer 124 grown during a prescribed time, and the horizontal axis represents the length (μm) of a side of a covering region. In the present embodiment, the thickness of the element formation layer 124 is the thickness grown during a prescribed time, and so an approximate value of the growth rate of the element formation layer 124 can be calculated by dividing this thickness by the prescribed time.

In FIG. 22, the rhomboid plotting points represent experimental data obtained when the bottom shape of the opening is a square in which a side is 10 μm, and the square plotting points represent experimental data obtained when the bottom shape of the opening is a square in which a side is 20 μm. Furthermore, the triangular plotting points represent experimental data obtained when the bottom shape of the opening is a rectangle in which a long side is 40 μm and a short side is 30 μm.

Based on FIG. 22, it is understood that the growth rate monotonically increases when the size of the covering region increases. Furthermore, it is understood that, when the length of a side of a covering region is 400 μm or less, the growth rate increases almost linearly, and so there is little variation due to the bottom shape of the opening. On the other hand, it is understood that, when the length of a side of a covering region is 500 μm, the growth rate increases suddenly relative to the cases in which the length of a side of a covering region is 400 μm or less, and so there is increased variation due to the bottom shape of the opening.

FIG. 23 shows a relationship between the variation coefficient of the growth rate of the element formation layer 124 and the distance between adjacent covering regions. Here, the variation coefficient is a ratio of the standard deviation to the average value, and can be calculated by dividing the standard deviation of the thickness at the three measurement points by the average value of this thickness. In FIG. 23, the vertical axis represents the variation coefficient of the thickness (Å) of the element formation layer 124 grown during a prescribed time, and the horizontal axis represents the distance (μm) between adjacent covering regions. FIG. 23 shows experimental data for cases in which the distance between adjacent covering regions is 0 μm, 20 μm, 50 μm, 100 μm, 200 μm, 300 μm, 400 μm, and 450 μm, respectively. In FIG. 23, the rhomboid plotting points represent experimental data obtained when the bottom shape of the opening is a square in which a side is 10 μm.

In FIG. 23, the experimental data for cases in which the distance between adjacent covering regions is 0 μm, 100 μm, 200 μm, 300 μm, 400 μm, and 450 μm, corresponds respectively to the experimental data in FIG. 22 for the cases in which the length of a side of a covering region is 500 μm, 400 μm, 300 μm, 200 μm, 100 μm, and 50 μm. The data concerning cases in which the distance between adjacent covering regions is 20 μm and 50 μm can each be obtained in the same way as the other experimental data by measuring the thickness of the element formation layer 124 in cases where the length of a side of a covering region is 480 μm and 450 μm, respectively.

Based on FIG. 23, it is understood that, in comparison with the case in which the distance between adjacent covering regions is 0 μm, setting this distance to be 20 μm results in a much more stable growth rate for the element formation layer 124. Based on the above results, it is understood that the growth rate of the crystal grown within the opening can be stabilized when adjacent covering regions are separated by even a small amount. Furthermore, it is understood that the growth rate of the crystal can be stabilized by arranging regions in which crystal growth occurs between adjacent covering regions. Even if the distance between adjacent covering regions is 0 μm, variations in the growth rate of the crystal can be restricted by arranging a plurality of openings at uniform intervals.

(Second Embodiment)

Semiconductor wafers were manufactured using the same steps as in the First Embodiment, and were respectively designed such that the length of a side of a covering region was 200 μm, 500 μm, 700 μm, 1000 μm, 1500 μm, 2000 μm, 3000 μm, and 4250 μm, and the thickness of the element formation layer 124 within the opening of each semiconductor wafer was measured. In the present embodiment, the $SiO_2$ layers were formed such that a plurality of $SiO_2$ layers having the same size were formed on each Si wafer 102. Furthermore, the $SiO_2$ layers were formed to be separated from each other. In the same way as in the First Embodiment, experimentation was performed for three bottom shapes of the opening, which are a square in which a side is 10 μm, a square in which a side is 20 μm, and a rectangle in which a short side is 30 μm and a long side is 40 μm. The growth conditions for the Ge layer 120 and the element formation layer 124 were the same as those in the First Embodiment.

(Third Embodiment)

The amount of trimethylgallium supplied was cut in half to approximately halve the growth rate of the element formation layer 124, but otherwise, the same processes and conditions as in the Second Embodiment were used and the thickness of the element formation layer 124 formed within the opening of each semiconductor wafer was measured. In the Third Embodiment, experimentation was performed for cases in which the bottom shape of the opening is a square in which length of a side is 10 μm while the length of a side of a covering region was respectively set to 200 μm, 500 μm, 1000 μm, 2000 μm, 3000 μm, and 4250 μm.

The experimental results for the Second and Third Embodiments are shown in FIGS. 24 to 34 and Table 1. FIG. 24 shows an average value of the thickness of the element formation layer 124 for each wafer according to the Second Embodiment. FIGS. 25 to 29 show electron microscope images of the element formation layer 124 for each wafer according to the Second Embodiment. FIGS. 30 to 34 show electron microscope images of the element formation layer 124 for each wafer according to the Third Embodiment. Table 1 shows an Ra value and a growth rate of the element formation layer 124 for each wafer according to the Second and Third Embodiments.

FIG. 24 shows the relationship between the growth rate of the element formation layer 124 and the sizes of the covering region and the opening. In FIG. 24, the vertical axis represents the thickness of the element formation layer 124 grown during a prescribed time, and the horizontal axis represents the length (μm) of a side of a covering region. In the present embodiment, the thickness of the element formation layer 124 is the thickness grown during a prescribed time, and so an approximate value of the growth rate of the element formation layer 124 can be calculated by dividing this thickness by the prescribed time.

In FIG. 24, the rhomboid plotting points represent experimental data obtained when the bottom shape of the opening is a square in which a side is 10 μm, and the square plotting points represent experimental data obtained when the bottom shape of the opening is a square in which a side is 20 μm. Furthermore, the triangular plotting points represent experimental data obtained when the bottom shape of the opening is a rectangle in which a long side is 40 μm and a short side is 30 μm.

Based on FIG. 24, it is understood that the growth rate increases stably until the size of a covering region increases to a point at which the length of a side of the covering region reaches 4250 μm. Based on the results shown in FIGS. 22 and 24, it is understood that the growth rate of the crystal grown within the opening can be stabilized when adjacent covering regions are separated by even a small amount. Furthermore, it is understood that the growth rate of the crystal can be stabilized by arranging regions in which crystal growth occurs between adjacent covering regions.

FIGS. 25 to 29 show results obtained by using an electron microscope to observe the top surface of the element formation layer 124 for each wafer according to the Second Embodiment. FIGS. 25 to 29 respectively show results obtained when the length of a side of a covering region is 4250 μm, 2000 μm, 1000 μm, 500 μm, and 200 μm. Based on FIGS. 25 to 29, it is understood that an increase in the size of the covering regions leads to worsening of the surface condition of the element formation layers 124.

FIGS. 30 to 34 show results obtained by using an electron microscope to observe the top surface of the element formation layer 124 for each wafer according to the Third Embodiment. FIGS. 30 to 34 respectively show results obtained when the length or a side of a covering region is 4250 μm, 2000 μm, 1000 μm, 500 μm, and 200 μm. Based on FIGS. 30 to 34, it is understood that an increase in the size of the covering regions leads to worsening of the surface condition of the element formation layers 124. Furthermore, it is understood that, in comparison to the results obtained for the Second Embodiment, the surface condition of the element formation layers 124 was improved.

Table 1 shows an Ra value (μm) and a growth rate (Å/min) of the element formation layer 124 for each wafer according to the Second and Third Embodiments. The thickness of the element formation layer 124 was measured by a surface profiler. The Ra value was calculated based on the results observed using a laser microscope device. Based on Table 1, it is understood that lower growth rates for the element formation layer 124 results in lower surface roughness. Furthermore, it is understood that the Ra value is no greater than 0.02 μm when the growth rate of the element formation layer 124 is no greater than 300 nm/min.

TABLE 1

| COVERING REGION SIDE LENGTH [μm] | SECOND EMBODIMENT | | THIRD EMBODIMENT | |
|---|---|---|---|---|
| | GROWTH RATE [Å/min] | Ra VALUE [μm] | GROWTH RATE [Å/min] | Ra VALUE [μm] |
| 200 | 526 | 0.006 | 286 | 0.003 |
| 500 | 789 | 0.008 | 442 | 0.003 |
| 1000 | 1216 | 0.012 | 692 | 0.005 |
| 2000 | 2147 | 0.017 | 1264 | 0.007 |
| 3000 | 3002 | 0.02 | 1831 | 0.008 |
| 4250 | 3477 | 0.044 | 2190 | 0.015 |

(Fourth Embodiment)

Figure 35:
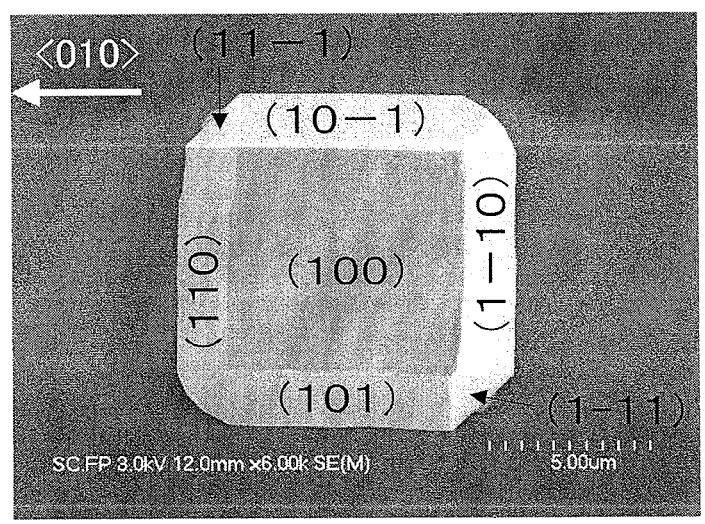
FIG. 35 shows an electron microscope image of an element formation layer 124 in the Fourth Embodiment.
Figure 37:
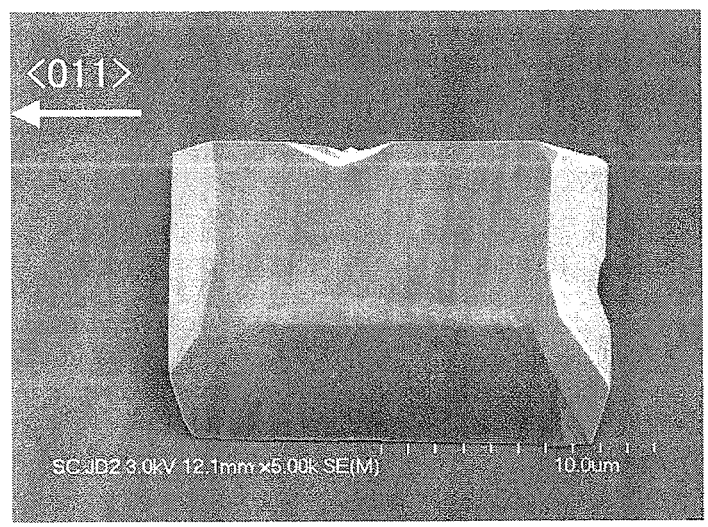
FIG. 37 shows an electron microscope image of an element formation layer 124 in the Fourth Embodiment.

In the same way as in the First Embodiment, a semiconductor wafer including an Si wafer 102, an inhibiting layer 104, a Ge layer 120, and a GaAs crystal serving as an example of the element formation layer 124 was manufactured. In the present embodiment, the inhibiting layer 104 was formed on the (100) surface of the top surface of the Si wafer 102. FIGS. 35 to 37 show electron microscope images of the top surface of the GaAs crystal formed on the above semiconductor wafer.

FIG. 35 shows results obtained when the GaAs crystal was grown within an opening that is arranged such that a side of the bottom shape of the opening is substantially parallel to the <010> direction of the Si wafer 102. In the present embodiment, the planar shape of the covering region was a square in which each side had a length of 300 μm. The bottom shape of the opening was a square in which a side is 10 μm. In FIG. 35, the arrow represents the direction <010>. As shown in FIG. 35, the obtained crystal had an ordered shape.

Based on FIG. 35, it is understood that the four side surfaces of the GaAs crystal are the (10-1) surface, the (1-10) surface, the (101) surface, and the (110) surface. Furthermore, it is understood from FIG. 35 that there is a (11-1) surface at the upper left corner of the GaAs crystal and a (1-11) surface at the lower right corner of the GaAs crystal. The (11-1) surface and the (1-11) surface are equivalent to a (−1-1-1) surface, and these are stable surfaces.

It is further understood from FIG. 35 that such stable surfaces are not present at the upper right corner or the lower left corner of the GaAs crystal. For example, in FIG. 35, even though a (111) surface may be present at the bottom left corner, this (11) surface is not present in this case. This is believed to be because the bottom left corner is sandwiched between the (110) surface and the (101) surface, which are more stable than the (111) surface.

FIG. 36 shows results obtained when the GaAs crystal was grown within an opening that was arranged such that a side of the bottom shape of the opening was substantially parallel to the <010> direction of the Si wafer 102. FIG. 36 shows results as seen from above at a 45° angle. In the present embodiment, the planar shape of the covering region was a square in which each side had a length of 50 μm. The bottom shape of the opening was a square in which the length of a side is 10 μm. In FIG. 36, the arrow represents the direction <010>. As shown in FIG. 36, the obtained crystal had an ordered shape.

FIG. 37 shows results obtained when the GaAs crystal was grown within an opening that was arranged such that a side of the bottom shape of the opening was substantially parallel to the <011> direction of the Si wafer 102. In the present embodiment, the planar shape of the covering region was a square in which each side had a length of 400 μm. The bottom shape of the opening was a square in which the length of a side is 10 μm. In FIG. 37, the arrow represents the direction <011>. As shown in FIG. 37, the obtained crystal had a shape that was more disordered than the shapes shown in FIGS. 35 and 36. This is believed to be because, as a result of the relatively unstable (111) surface appearing on the side surface of the GaAs crystal, disorder occurred in the shape of the crystal.

(Fifth Embodiment)

In the same way as in the First Embodiment, a semiconductor wafer including an Si wafer 102, an inhibiting layer 104, a Ge layer 120, and a GaAs layer serving as an example of the element formation layer 124 was manufactured. In the present embodiment, an intermediate layer was formed between the Ge layer 120 and the element formation layer 124. In the present embodiment, the planar shape of the covering region was a square in which each side had a length of 200 μm. The bottom shape of the Opening was a square in which a side is 10 μm. The CVD method was used to form the Ge layer 120 with a thickness of 850 nm within the opening, and then annealing was performed at 800° C.

After annealing the Ge layer 120, the temperature of the Si wafer 102 on which the Ge layer 120 is formed was set to 550° C. and the intermediate layer was formed using the MOCVD method. The intermediate layer was grown using trimethylgallium and arsine as the raw material gas. The thickness of the intermediate layer was 30 μm. After this, the temperature of the Si wafer 102 on which the intermediate layer is formed was raised to a temperature of 640° C., after which the MOCVD method was used to form the GaAs layer as an example of the element formation layer 124. The thickness of the GaAs layer was 500 nm. Other conditions were the same as those used when manufacturing the semiconductor wafer of the First Embodiment.

Figure 38:
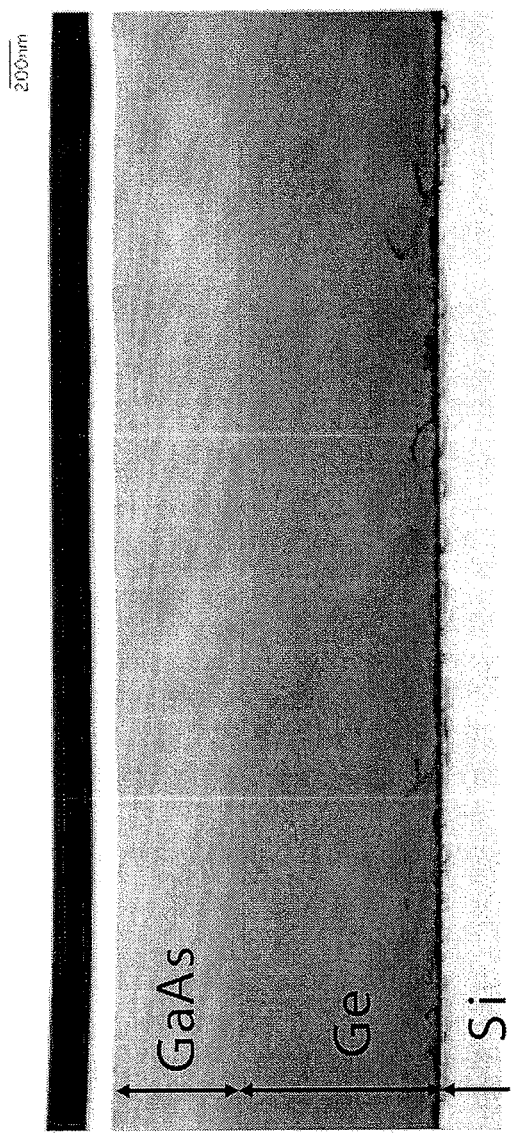
FIG. 38 shows an electron microscope image of the semiconductor wafer of the Fifth Embodiment.

FIG. 38 shows results obtained by viewing a cross-section of the manufactured semiconductor wafer with a transmission electron microscope. As shown in FIG. 38, dislocation was not observed in the Ge layer 120 or the GaAs layer. Therefore, it is understood that, by adopting the configuration described above, a high-quality Ge layer and a compound semiconductor layer that lattice matches or pseudo-lattice matches with the Ge layer can be formed on the Si wafer.

(Sixth Embodiment)

In the same way as in the Fifth Embodiment, a semiconductor wafer including an Si wafer 102, an inhibiting layer 104, a Ge layer 120, an intermediate layer, and a GaAs layer serving as an example of the element formation layer 124 was manufactured, and an HBT element structure was then formed using the resulting semiconductor wafer. The HBT element structure was manufactured using the following steps. First, in the same way as in the Fifth Embodiment, a semiconductor wafer was manufactured. In the present embodiment, the planar shape of the covering region was a square in which each side had a length of 50 μm. The bottom shape of the opening was a square in which a side is 20 μm. Other conditions were the same as those used when manufacturing the semiconductor wafer of the Fifth Embodiment.

Next, the MOCVD method was used to form a semiconductor layer on the top surface of the GaAs layer of the semiconductor wafer. As a result, an liar element structure was formed that included, in the stated order, the Si wafer 102, a Ge layer 120 with a thickness of 850 nm, an intermediate layer with a thickness of 30 nm, an undoped GaAs layer with a thickness of 500 μm, an n-type GaAs layer with a thickness of 300 nm, an n-type InGaP layer with a thickness of 20 nm, an n-type GaAs layer with a thickness of 3 nm, a GaAs layer with a thickness of 300 μm, a p-type GaAs layer with a thickness of 50 μm, an n-type InGaP layer with a thickness of 20 μm, an n-type GaAs layer with a thickness of 120 nm, and an n-type InGaAs layer with a thickness of 60 μm. Electrodes were arranged on the resulting HBT element structure to form an HBT element, which is an example of an electronic element or an electronic device in the semiconductor layers described above, Si was used as the n-type impurity. In the semiconductor layers described above, C was used as the p-type impurity.

Figure 39:
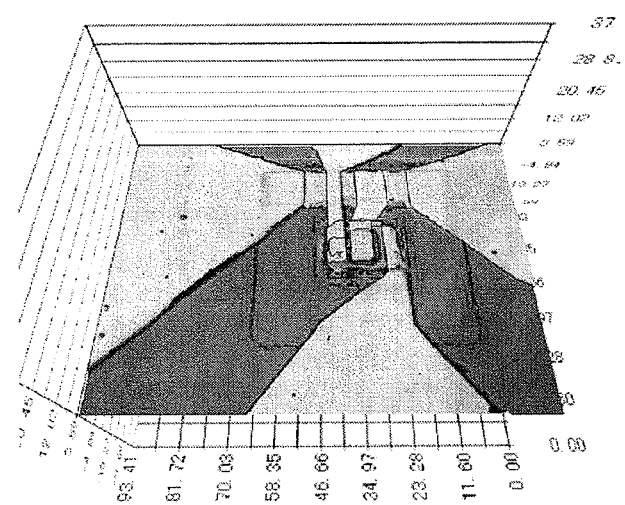
FIG. 39 shows a laser microscope image of the HBT element of the Sixth Embodiment.

FIG. 39 shows a laser microscope image of the manufactured HBT element. In FIG. 39, the light gray portions represent the electrodes. Based on FIG. 39, it is understood that three electrodes are lined up in the open region arranged near the center of the square covering region. The three electrodes are respectively, in order from the left side of FIG. 39, a base electrode, an emitter electrode, and a collector electrode of the HBT element. Upon measuring the electrical characteristics of this HBT element, it was confirmed that operation as a transistor was possible. Furthermore, upon observing a cross-section of the HBT element with a transmission electron microscope, no dislocation was seen.

(Seventh Embodiment)

In the same manner as the Sixth Embodiment, three HBT elements having the same structure as the HBT element of the Sixth Embodiment were manufactured. The three HBT elements were connected in parallel. In the present embodiment, the planar shape of each covering region was a rectangle in which a long side had a length of 100 μm and a short side had a length of 50 μm. Three openings were formed within these covering regions. The bottom shape of each opening was a square in which a side is 15 μm. Other conditions were the same as those used when manufacturing the HBT element of the Sixth Embodiment.

FIG. 40 shows a laser microscope image of the manufactured HBT element. In FIG. 40, the light gray portions represent the electrodes. Based on FIG. 40, it is understood that the three HBT elements are connected in parallel. Upon measuring the electrical characteristics of this electronic element, it was confirmed that operation as a transistor was possible.

(Eighth Embodiment)

HBT elements were manufactured with different bottom areas for the openings, and the relationship between the bottom area of an opening and the electric characteristics of the resulting HBT element was examined. HBT elements were manufactured in the same manner as the Sixth Embodiment. The base sheet resistance value $R_b$ (Ω/□) and the current gain β were measured as the electrical characteristics of the HBT elements. The current gain β was calculated by dividing the value of the collector current by the value of the base current. Experimentation was performed for HBT elements having five bottom shapes of the opening, which were a square in which a side is 20 μm, a rectangle in which a short side is 20 μm and a long side is 40 μm, a square in which a side is 30 μm, a rectangle in which a short side is 30 μm and a long side is 40 μm, and a rectangle in which a short side is 20 μm and a long side is 80 μm.

When the bottom shape of the opening was a square, the opening was formed such that one of two orthogonal sides of the bottom shape of the opening was parallel to the direction <010> of the Si wafer 102, and the other of the two orthogonal sides was parallel to the direction <001> of the Si wafer 102. When the bottom shape of the opening was a rectangle, the opening was formed such that a long side of the bottom shape of the opening was parallel to the direction <010> of the Si wafer 102, and a short side was parallel to the direction <001> of the Si wafer 102. Experimentation was performed mainly for cases in which the planar shape of the covering region was a square in which a side had a length of 300 μm.

Figure 41:
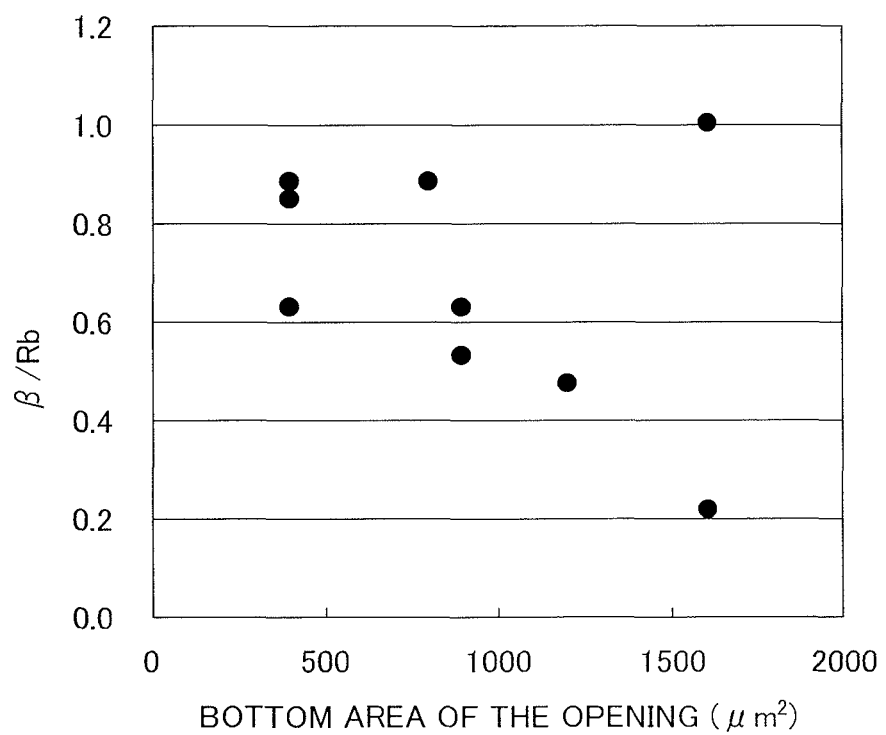
FIG. 41 shows a relationship between the electrical characteristics of HBT elements and the area of the open regions.

FIG. 41 shows a relationship between the bottom area (μm$^2$) of the opening and a ratio of the current gain β to the base sheet resistance value $R_b$ of the HBT elements described above. In FIG. 41, the vertical axis represents a value obtained by dividing the current gain β by the base sheet resistance value $R_b$, and the horizontal axis represents the bottom area of the opening. FIG. 41 does not show the current gain but high values from 70 to 100 were obtained for the current gain. On the other hand, the current gain β was no greater than 10 when the HBT elements were formed by forming the same HBT element structures over the entire surface of the Si wafer 102.

Therefore, it is understood that a device with favorable electrical characteristics can be manufactured by forming the HBT element structures locally on the top surface of the Si wafer 102. It is understood that a device with particularly good electrical characteristics can be manufactured when a side of the bottom shape of the opening is no greater than 80 μm or when the bottom area of the opening is no greater than 1600 μm$^2$.

Based on FIG. 41, it is understood that the variation in the ratio of the current gain β to the base sheet resistance value $R_b$ is smaller when the bottom area of the opening is 900 μm$^2$ or less, than when the bottom area of the opening is 1600 μm$^2$ or more. Therefore, it is understood that the device described above can be manufactured with good yield when a side of the bottom shape of the opening is no greater than 40 μm or when the bottom area of the opening is no greater than 900 μm$^2$.

As described above, a semiconductor wafer was manufactured using a method of manufacturing a semiconductor wafer that includes (i) forming an inhibiting layer that inhibits crystal growth on a principal surface of a silicon wafer, (ii) patterning the inhibiting layer to form an opening in the inhibiting layer that passes therethrough in a direction substantially perpendicular to the principal surface of the wafer to expose the wafer, (iii) crystal-growing a Ge layer contacting the wafer within the opening, and (iv) crystal-growing a functional layer on the Ge layer. A semiconductor wafer was manufactured using a method of manufacturing a semiconductor wafer that includes forming an inhibiting layer that has an opening and that inhibits crystal growth on an Si wafer, forming a Ge layer in the opening, and then forming a functional layer.

As described above, a semiconductor wafer was manufactured by (i) forming an inhibiting layer that inhibits crystal growth on a principal surface of a silicon wafer, (ii) forming an opening in the inhibiting layer that passes therethrough in a direction substantially perpendicular to the principal surface of the wafer to expose the wafer, (iii) crystal-growing a Ge layer contacting the wafer within the opening, and (iv) crystal-growing a functional layer on the Ge layer. A semiconductor wafer was manufactured that includes an Si wafer, an inhibiting layer provided on the Si wafer that has an opening and that inhibits crystal growth, a Ge layer formed in the opening, and a functional layer formed on the Ge layer.

As described above, an electronic device was manufactured by (i) forming an inhibiting layer that inhibits crystal growth on a principal surface of a silicon wafer, (ii) forming an opening in the inhibiting layer that passes therethrough in a direction substantially perpendicular to the principal surface of the wafer to expose the wafer, (iii) crystal-growing a Ge layer contacting the wafer within the opening, (iv) crystal-growing a functional layer on the Ge layer, and (v) forming an electronic element on the functional layer. An electronic device was manufactured that includes an Si wafer, an inhibiting layer provided on the Si wafer that has an opening and that inhibits crystal growth, a Ge layer formed in the opening, a functional layer formed after formation of the Ge layer, and an electronic element formed on the functional layer.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

INDUSTRIAL APPLICABILITY

A crystal thin film with good crystallinity can be formed on an inexpensive silicon wafer, and this crystal thin film can be used to form a semiconductor wafer, an electronic device, or the like.

The invention claimed is:
1. A semiconductor wafer comprising:
an Si wafer;
an inhibiting layer that is formed on the wafer and that inhibits crystal growth, the inhibiting layer including a covering region that covers a portion of the wafer and an open region that does not cover a portion of the wafer within the covering region;
a Ge layer that is crystal-grown on the wafer in the open region; and
a functional layer that lattice matches or pseudo-lattice matches with Ge and is crystal-grown on the Ge layer,
wherein an area of the open region is no greater than 1 mm$^2$, a bottom surface area of the open region is no greater than 1 mm$^2$ and an arithmetic mean roughness of the functional layer is no greater than 0.02 μm.

2. The semiconductor wafer according to claim 1, wherein the Ge layer is formed by annealing with a temperature and duration that enables movement of crystal defects.

3. The semiconductor wafer according to claim 2, wherein the annealing is repeated a plurality of times.

4. The semiconductor wafer according to claim 1, further comprising a GaAs layer formed at a temperature no greater than 500° C. between the Ge layer and the functional layer.

5. The semiconductor wafer according to claim 1, wherein a surface of the Ge layer facing the functional layer is surface processed by a gas including P.

6. The semiconductor wafer according to claim 1, wherein the functional layer is a group 3-5 compound layer or a group 2-6 compound layer that lattice matches or pseudo-lattice matches with Ge.

7. The semiconductor wafer according to claim 1, wherein the functional layer is a group 3-5 compound layer that lattice matches or pseudo-lattice matches with Ge, in which a group 3 element includes at least one of Al, Ga, and In and a group 5 element includes at least one of N, P, As, and Sb.

8. The semiconductor wafer according to claim 1, wherein the inhibiting layer is an electric insulator.

9. The semiconductor wafer according to claim 8, wherein the inhibiting layer is a silicon oxide layer, a silicon nitride layer, a silicon oxynitride layer, an aluminum oxide layer, or a combination of these layers.

10. A semiconductor wafer obtained by:
forming an inhibiting layer that inhibits crystal growth on a principal surface of an Si wafer and forming an opening in an open region in the inhibiting layer that passes therethrough in a direction substantially perpendicular to the principal surface of the wafer to expose the wafer;
crystal-growing a Ge layer to contact the wafer within the opening; and
crystal-growing a functional layer that lattice matches or pseudo-lattice matches with Ge on the Ge layer while the Ge layer still contacts the wafer,
wherein an area of the open region is no greater than 1 mm$^2$, a bottom surface area of the open region is no greater than 1 mm$^2$ and an arithmetic mean roughness of the functional layer is no greater than 0.02 μm.

11. A semiconductor wafer comprising:
an Si wafer;
an inhibiting layer provided on the Si wafer that has an opening in an open region and that inhibits crystal growth;
a Ge layer formed on the wafer in the opening; and
a functional layer that lattice matches or pseudo-lattice matches with Ge and that is formed after forming the Ge layer,
wherein an area of the open region is no greater than 1 mm$^2$, a bottom surface area of the open region is no greater than 1 mm$^2$ and an arithmetic mean roughness of the functional layer is no greater than 0.02 μm.

12. The semiconductor wafer according to claim 11, wherein the functional layer is formed within the opening.

13. A method of manufacturing a semiconductor wafer, comprising:
forming an inhibiting layer that inhibits crystal growth on a silicon wafer;
patterning the inhibiting layer to form a covering region that covers a portion of the wafer and an open region that does not cover the wafer within the covering region;
crystal-growing a Ge layer on the wafer at least in the open region of the inhibiting layer; and
crystal-growing a functional layer that lattice matches or pseudo-lattice matches with Ge on the Ge layer while the Ge layer is still on the wafer,
wherein an area of the open region is no greater than 1 mm$^2$, a bottom surface area of the open region is no greater than 1 mm$^2$ and an arithmetic mean roughness of the functional layer is no greater than 0.02 μm.

14. The method of manufacturing a semiconductor wafer according to claim 13, further comprising annealing the crystal-grown Ge layer with a temperature and duration that enables movement of crystal defects.

15. The method of manufacturing a semiconductor wafer according to claim 14, further comprising
repeating the annealing a plurality of times.

16. A method of manufacturing a semiconductor wafer, comprising:

forming an inhibiting layer that inhibits crystal growth on a principal surface of a silicon wafer;
patterning the inhibiting layer to form an opening in an open region in the inhibiting layer that passes therethrough in a direction substantially perpendicular to the principal surface of the wafer to expose the wafer;
crystal-growing a Ge layer contacting the wafer within the opening; and
crystal-growing a functional layer that lattice matches or pseudo-lattice matches with Ge on the Ge layer while the Ge layer still contacts the wafer,
wherein an area of the open region is no greater than 1 mm², a bottom surface area of the open region is no greater than 1 mm² and an arithmetic mean roughness of the functional layer is no greater than 0.02 μm.

17. The method of manufacturing a semiconductor wafer according to claim 16, further comprising annealing the Ge layer with a temperature and duration that enables movement of crystal defects within the Ge layer.

18. The method of manufacturing a semiconductor wafer according to claim 17, wherein
the annealing includes annealing the Ge layer at a temperature greater than or equal to 680° C. and less than 900° C.

19. The method of manufacturing a semiconductor wafer according to claim 17, wherein
the annealing includes annealing the Ge layer in an atmosphere that contains hydrogen.

20. The method of manufacturing a semiconductor wafer according to claim 17, wherein
the annealing is performed a plurality of times.

21. The method of manufacturing a semiconductor wafer according to claim 16, wherein
the Ge layer is selectively crystal-grown in the opening using a CVD method with a pressure between 0.1 Pa and 100 Pa, inclusive.

22. The method of manufacturing a semiconductor wafer according to claim 16, wherein
the Ge layer is selectively crystal-grown in the opening using a CVD method in an atmosphere that includes raw material gas containing halogen atoms.

23. The method of manufacturing a semiconductor wafer according to claim 16, further comprising, after forming the Ge layer and before forming the functional layer, forming a GaAs layer at a temperature no greater than 600° C.

24. The method of manufacturing a semiconductor wafer according to claim 16, further comprising, after forming the Ge layer and before forming the functional layer, processing a top surface of the Ge layer with a gas containing P.

25. The method of manufacturing a semiconductor wafer according to claim 16, wherein
the functional layer is a group 3-5 compound layer that includes at least one element selected from a group including Al, Ga, and In as a group 3 element and includes at least one element selected from a group including N, P, As, and Sb as a group 5 element, and
the functional layer is crystal-grown at a growth rate no less than 1 nm/min and no greater than 300 nm/min.

26. A method of manufacturing a semiconductor wafer, comprising:
forming an inhibiting layer that has an opening in an open region and that inhibits crystal growth on an Si wafer;
forming a Ge layer on the wafer in the opening; and
after forming the Ge layer, forming a functional layer that lattice matches or pseudo-lattice matches with Ge while the Ge layer is still on the wafer,
wherein an area of the open region is no greater than 1 mm², a bottom surface area of the open region is no greater than 1 mm² and an arithmetic mean roughness of the functional layer is no greater than 0.02 μm.

27. The method of manufacturing a semiconductor wafer according to claim 26, wherein
the functional layer is formed within the opening.

28. An electronic device comprising:
an Si wafer;
an inhibiting layer that is formed on the wafer and that inhibits crystal growth, the inhibiting layer including a covering region that covers a portion of the wafer and an open region that does not cover a portion of the wafer within the covering region;
a Ge layer that is crystal-grown on the wafer in the open region;
a functional layer that lattice matches or pseudo-lattice matches with Ge and is crystal-grown on the Ge layer; and
an electronic element that is formed on the functional layer,
wherein an area of the open region is no greater than 1 mm², a bottom surface area of the open region is no greater than 1 mm² and an arithmetic mean roughness of the functional layer is no greater than 0.02 μm.

29. The electronic device according to claim 28, wherein one electronic element is formed in each open region.

30. The electronic device according to claim 28, wherein wiring connected to the electronic element or a bonding pad for the wiring is formed on the covering region.

31. The electronic device according to claim 28, wherein
a plurality of the covering regions and a plurality of the open regions are formed on the wafer, and
the plurality of covering regions and the plurality of open regions are formed at uniform intervals.

32. An electronic device obtained by:
forming an inhibiting layer that inhibits crystal growth on a principal surface of a silicon wafer;
forming an opening in an open region in the inhibiting layer that passes therethrough in a direction substantially perpendicular to the principal surface of the wafer to expose the wafer;
crystal-growing a Ge layer contacting the wafer within the opening;
crystal-growing a functional layer that lattice matches or pseudo-lattice matches with Ge on the Ge layer while the Ge layer still contacts the wafer; and
forming an electronic element on the functional layer,
wherein an area of the open region is no greater than 1 mm², a bottom surface area of the open region is no greater than 1 mm² and an arithmetic mean roughness of the functional layer is no greater than 0.02 μm.

33. An electronic device comprising:
an Si wafer;
an inhibiting layer that is provided on the Si wafer, has an opening in an open region, and inhibits crystal growth;
a Ge layer formed on the wafer in the opening;
a functional layer that lattice matches or pseudo-lattice matches with Ge and that is formed after the Ge layer is formed; and
an electronic element formed on the functional layer,
wherein an area of the open region is no greater than 1 mm², a bottom surface area of the open region is no greater than 1 mm² and an arithmetic mean roughness of the functional layer is no greater than 0.02 μm.

34. The electronic device according to claim 33, wherein the functional layer is formed within the opening.

* * * * *